US012616038B2

(12) United States Patent

Hoffman et al.

(10) Patent No.: US 12,616,038 B2

(45) Date of Patent: Apr. 28, 2026

(54) INTERCONNECT SUBSTRATE AND METHOD OF MAKING

(71) Applicant: Deca Technologies USA, Inc., Tempe, AZ (US)

(72) Inventors: Paul R. Hoffman, San Diego, CA (US); Timothy L. Olson, Phoenix, AZ (US); Craig Bishop, Scottsdale, AZ (US); Robin Davis, Vancouver, WA (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 19/232,724

(22) Filed: Jun. 9, 2025

(65) Prior Publication Data

US 2026/0011574 A1    Jan. 8, 2026

Related U.S. Application Data

(60) Provisional application No. 63/667,609, filed on Jul. 3, 2024.

(51) Int. Cl.
H01L 21/48 (2006.01)
H01L 21/56 (2006.01)
(Continued)

(52) U.S. Cl.
CPC ........ H01L 21/4857 (2013.01); H01L 21/486 (2013.01); H01L 21/565 (2013.01);
(Continued)

(58) Field of Classification Search
CPC . H01L 21/4857; H01L 21/486; H01L 21/565; H01L 23/5383; H01L 23/5386;
(Continued)

(56) References Cited

U.S. PATENT DOCUMENTS

| | | | |
|---|---|---|---|
| 5,570,274 A | 10/1996 | Saito | |
| 5,790,384 A | 8/1998 | Ahmad | |

(Continued)

FOREIGN PATENT DOCUMENTS

| | | |
|---|---|---|
| CN | 104253105 | 12/2014 |
| CN | 105144367 | 12/2015 |

(Continued)

OTHER PUBLICATIONS

Anandan, Ramasamy et al. "Embedded Wafer Level Bga (EWLB)—Extra-Small and ELGA Packages." Electronics Packaging Technology Conference (EPTC), 2011. pp. 412-416.

(Continued)

*Primary Examiner* — Marlon T Fletcher

*Assistant Examiner* — Christina A Sylvia

(74) *Attorney, Agent, or Firm* — Booth Udall, PLC; Kenneth C. Booth

(57) ABSTRACT

A method of making an interconnect substrate, comprising disposing an embedded component and at least one tracking identifier in a substrate core, and planarizing the substrate core to form a planar surface, forming a conductive layer over a frontside planar surface, disposing a layer of dielectric over the frontside planar surface, the embedded component, and the conductive layer, rotating the substrate core such that a back surface of the substrate core is configured for processing, and forming a conductive layer over the back surface of the substrate core.

30 Claims, 18 Drawing Sheets

(51) Int. Cl.
    *H01L 23/538*        (2006.01)
    *H01L 23/544*        (2006.01)
    *H01L 23/00*         (2006.01)

(52) U.S. Cl.
    CPC ...... *H01L 23/5383* (2013.01); *H01L 23/5386*
        (2013.01); *H01L 23/544* (2013.01); *H01L*
        *23/562* (2013.01); *H01L 24/16* (2013.01);
        *H01L 2223/54426* (2013.01); *H01L*
        *2223/54433* (2013.01); *H01L 2224/16227*
        (2013.01)

(58) Field of Classification Search
    CPC ..... H01L 23/544; H01L 23/562; H01L 24/16;
        H01L 2223/54426; H01L 2223/54433;
        H01L 2224/16227
    See application file for complete search history.

(56)         References Cited

U.S. PATENT DOCUMENTS

| | | | |
|---|---|---|---|
| 6,121,065 A | 9/2000 | Wong | |
| 6,133,626 A | 10/2000 | Hawke | |
| 6,294,406 B1 | 9/2001 | Bertin | |
| 7,456,496 B2 | 11/2008 | Hwee | |
| 7,476,980 B2 | 1/2009 | Rebibis | |
| 7,569,422 B2 | 8/2009 | Lin | |
| 7,829,380 B2 | 11/2010 | Irsigler | |
| 8,018,036 B2 | 9/2011 | Goh | |
| 8,030,770 B1 * | 10/2011 | Juskey | H01L 25/16 |
| | | | 257/737 |
| 8,164,171 B2 | 4/2012 | Lin | |
| 8,487,435 B2 | 7/2013 | Juskey | |
| 8,503,186 B2 | 8/2013 | Lin | |
| 8,653,647 B2 | 2/2014 | Masuda | |
| 8,664,044 B2 | 3/2014 | Jin | |
| 8,804,360 B2 | 8/2014 | Lin | |
| 8,860,207 B2 | 10/2014 | Jin | |
| 9,196,509 B2 | 11/2015 | Scanlan | |
| 9,355,945 B1 | 5/2016 | Ge | |
| 9,368,438 B2 | 6/2016 | Lin | |
| 9,385,074 B2 | 7/2016 | Pendse | |
| 9,391,041 B2 | 7/2016 | Lin | |
| 9,553,000 B2 | 1/2017 | Yu | |
| 9,601,463 B2 | 3/2017 | Yu | |
| 9,613,931 B2 | 4/2017 | Lin | |
| 9,685,390 B2 | 6/2017 | Hu | |
| 9,704,735 B2 | 7/2017 | Konchady | |
| 9,793,231 B2 | 10/2017 | Chen | |
| 9,831,170 B2 | 11/2017 | Scanlan | |
| 10,056,351 B2 | 8/2018 | Yu | |
| 10,229,892 B2 | 3/2019 | Appelt | |
| 10,325,879 B2 | 6/2019 | Yu | |
| 10,373,902 B2 | 8/2019 | Scanlan | |
| 10,490,468 B2 | 11/2019 | Tsai | |
| 10,510,721 B2 | 12/2019 | Bhagavat | |
| 10,593,620 B2 | 3/2020 | Agarwal | |
| 10,770,416 B2 | 9/2020 | Kim | |
| 10,879,224 B2 | 12/2020 | Chen | |
| 10,886,263 B2 | 1/2021 | Chen | |
| 11,024,605 B2 | 6/2021 | Chen | |
| 11,056,453 B2 | 7/2021 | Olson | |
| 11,171,076 B2 | 11/2021 | Yu | |
| 11,211,360 B2 | 12/2021 | Huang | |
| 11,276,656 B2 | 3/2022 | Chen | |
| 11,502,062 B2 | 11/2022 | Chen | |
| 2003/0122246 A1 | 7/2003 | Lin | |
| 2007/0278701 A1 | 12/2007 | Chang | |
| 2008/0038874 A1 | 2/2008 | Lin | |
| 2009/0212428 A1 | 8/2009 | Yang | |
| 2010/0290191 A1 | 11/2010 | Lin | |
| 2011/0156239 A1 | 6/2011 | Jin | |
| 2011/0202896 A1 | 8/2011 | Scanlan | |

| | | | |
|---|---|---|---|
| 2011/0210442 A1 | 9/2011 | Lim | |
| 2011/0285007 A1 | 11/2011 | Chi | |
| 2012/0038061 A1 | 2/2012 | Su | |
| 2012/0153493 A1 | 6/2012 | Lee | |
| 2012/0228754 A1 | 9/2012 | Liu | |
| 2013/0075894 A1 | 3/2013 | Gallegos | |
| 2013/0075924 A1 | 3/2013 | Lin | |
| 2013/0168830 A1 | 7/2013 | Uehling | |
| 2014/0102772 A1 | 4/2014 | Chen | |
| 2014/0124937 A1 | 5/2014 | Wu | |
| 2014/0335658 A1 | 11/2014 | Scanlan | |
| 2015/0249856 A1 | 9/2015 | Pereira | |
| 2015/0380386 A1 | 12/2015 | Vincent | |
| 2016/0005705 A1 | 1/2016 | Masumoto | |
| 2016/0064334 A1 | 3/2016 | Bishop | |
| 2016/0254229 A1 | 9/2016 | Yu | |
| 2017/0148755 A1 | 5/2017 | Scanlan | |
| 2017/0213797 A1 | 7/2017 | Gulpen | |
| 2018/0019221 A1 | 1/2018 | Appelt | |
| 2018/0082911 A1 | 3/2018 | Bishop | |
| 2018/0102311 A1 * | 4/2018 | Shih | H01L 25/0655 |
| 2018/0130761 A1 | 5/2018 | Kim | |
| 2018/0366423 A1 | 12/2018 | Ong | |
| 2019/0027450 A1 | 1/2019 | Choi | |
| 2019/0221520 A1 | 7/2019 | Kim | |
| 2019/0259718 A1 | 8/2019 | Choi | |
| 2019/0304938 A1 | 10/2019 | Hadizadeh | |
| 2019/0326257 A1 | 10/2019 | Agarwal | |
| 2019/0333893 A1 | 10/2019 | Yu | |
| 2019/0341351 A1 | 11/2019 | May | |
| 2020/0029435 A1 | 1/2020 | Baek | |
| 2020/0043853 A1 | 2/2020 | Kim | |
| 2020/0058627 A1 | 2/2020 | Chen | |
| 2020/0194330 A1 | 6/2020 | Ramanathan | |
| 2020/0219815 A1 * | 7/2020 | Elsherbini | H01L 25/0655 |
| 2020/0266184 A1 | 8/2020 | Pietambaram | |
| 2020/0273838 A1 | 8/2020 | Williams | |
| 2020/0294923 A1 | 9/2020 | Bhagavat | |
| 2020/0328161 A1 | 10/2020 | Lin | |
| 2020/0350272 A1 | 11/2020 | Hong | |
| 2020/0402941 A1 * | 12/2020 | Olson | H01L 23/3128 |
| 2020/0403299 A1 * | 12/2020 | Gupta | H01L 23/5389 |
| 2020/0409859 A1 | 12/2020 | Saleh | |
| 2020/0411397 A1 | 12/2020 | Han | |
| 2020/0411443 A1 | 12/2020 | Guo | |
| 2021/0066263 A1 | 3/2021 | Chen | |
| 2021/0366854 A1 | 11/2021 | Yu | |
| 2021/0366877 A1 | 11/2021 | Wu | |
| 2022/0005760 A1 | 1/2022 | Dadvand | |
| 2022/0262742 A1 | 8/2022 | Hou | |
| 2022/0352106 A1 | 11/2022 | Sandstrom | |
| 2023/0163112 A1 | 5/2023 | We | |
| 2023/0275047 A1 | 8/2023 | Chen | |
| 2023/0317581 A1 | 10/2023 | Tang | |
| 2024/0213135 A1 | 6/2024 | Olson | |

FOREIGN PATENT DOCUMENTS

| | | |
|---|---|---|
| CN | 212136437 U | 12/2020 |
| CN | 112234035 A | 1/2021 |
| CN | 116544181 | 8/2023 |
| CN | 117438319 | 1/2024 |
| JP | 2018032750 | 3/2018 |
| KR | 20150009668 | 1/2015 |
| KR | 1020160123959 | 10/2016 |
| KR | 20170094207 | 8/2017 |
| KR | 20180084877 | 7/2018 |
| KR | 20210134983 | 11/2021 |
| KR | 20210148855 | 12/2021 |
| KR | 20230037608 | 3/2023 |
| TW | 1261901 B | 9/2006 |
| TW | 201413845 | 4/2014 |
| TW | 201712822 | 4/2017 |
| TW | 202205600 A | 2/2022 |
| TW | 202234636 A | 9/2022 |
| TW | 202315014 A | 4/2023 |

(56)                    References Cited

FOREIGN PATENT DOCUMENTS

| | | |
|---|---|---|
| TW | 202401664 | 1/2024 |
| WO | 2020263952 | 12/2020 |

OTHER PUBLICATIONS

Boettcher, Lars et al. Next Generation System in a Package Manufacturing by Embedded Chip Technologies. Additional Conferences (Device Packaging, HiTEC, HiTEN, & CICMT). 2010.

Boettcher, Lars et al. "Embedding of Chips for System in Package Realization—Technology and Applications." 2008. pp. 383-386.

Braun, Tanja et al. "Fan-Out Wafer and Panel Level Packaging as Packaging Platform for Heterogeneous Integration." Micromachines. 2019. vol. 10, pp. 342.

Jin, Yonggang et al. "Development and Characterization of Next Generation EWLB Embedded Wafer Level BGA) Packaging." ECTC, 2012. pp. 1388-1393.

Jin, Yonggang et al. "Enhanced Fan-Out WLP for High Power Device Packaging." International Electronics Manufacturing Technology Conference (IEMT), 2012.

Kurita, Yoichiro et al. "Fan-Out WLP With Highly Flexible Design Capabilities." 3rd Electronic System-Integration Technology Conference (ESTC), Sep. 13-16, 2010.

Ma, Yiyi et al. "Thermal Cycling Reliability Assessment and Enhancement of Embedded Wafer Level LGA Packages for Power Applications." Electronic Packaging Technology Conference (EPTC), 2012. pp. 606-611.

Motohashi, N., et al. System in Wafer Level Package Technology with RDL first process, 2011 Electronic Components and Technology Conferencepp. 59-64.

Stahr, Hannes et al. "Embedded Components on the Way to Industrialisation." 2011. https://ats.het/wp-content/uploads/2017/03/SMTA_Austin_TX_2011_ECP_Paper.pdf.

* cited by examiner

INTERCONNECT SUBSTRATE AND METHOD OF MAKING

CROSS REFERENCE TO RELATED APPLICATIONS

This disclosure claims the benefit, including the filing date, of U.S. Provisional Patent Application No. 63/667,609 entitled "Molded Direct Contact Interconnect Substrate and Method of Making the Same" that was filed on Jul. 3, 2024, the entire disclosure of which is hereby incorporated herein by this reference.

TECHNICAL FIELD

The disclosure relates to the field of electronic assemblies, semiconductor packages and substrates and methods for forming the same. More particularly, the disclosure relates to molded and build-up substrates and related methods. The substrates include a substrate core, dielectric layers, and may include at least one embedded component. Methods for forming the interconnect substrate include a rotation or flip for processing on opposing sides.

BACKGROUND

Semiconductor devices, packages, and substrates are commonly found in modern electronic products. Semiconductor assemblies vary in the number and density of electrical components and include both passive and active devices, including semiconductor chips or semiconductor die. Discrete devices generally contain one type of electrical component, for example, discrete semiconductor devices comprise light emitting diodes (LEDs), small signal transistors, and power metal oxide semiconductor field effect transistors (MOSFET), while discrete passive devices comprise resistors, capacitors, and inductors. Integrated semiconductor devices typically contain hundreds to millions of electrical components. Examples of integrated semiconductor devices include microcontrollers, microprocessors, optical devices, charged-coupled devices (CCDs), solar cells, and digital micro-mirror devices (DMDs).

Semiconductor devices perform a wide range of functions such as signal processing, high-speed calculations, transmitting and receiving electromagnetic signals, optical signals, or both, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor assemblies and semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device, such as a chip or semiconductor die contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, a wafer fabrication manufacturing process, and packaging manufacturing process, each involving potentially hundreds of steps. Wafer fabrication manufacturing involves the formation of transistors in a front-end of line (FEOL) process, such as forming plurality of semiconductor die on the surface of a semiconductor wafer, and then interconnect and dielectric processes through to passivation in back-end of line (BEOL) process. Each semiconductor die is typically identical and contains circuits formed by electrically connecting active and passive components. The packaging manufacturing process involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing and packaging of semiconductor assemblies is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. The packaging manufacturing process may result in semiconductor device packages with a smaller footprint by improvements in electrical interconnection and packaging materials.

SUMMARY

An opportunity exists for improved packages, including applications for semiconductor manufacturing. Aspects of this disclosure relate to a method of making an interconnect substrate, comprising disposing at least one embedded component and at least one tracking identifier in a substrate core, wherein: the substrate core comprises one or more of: a dielectric, encapsulant, ceramic, glass, polymer, mold compound such as epoxy or a thermoset material, a printed circuit board (PCB) with or without routing, a PCB core, and silicon, and combinations thereof, and the embedded component comprising one or more of: a semiconductor chip or semiconductor device, a chiplet, an active device or active component, an integrated circuit (IC), a passive device, an integrated passive device (IPD), a deep trench capacitor (DTC), a transformer, a voltage regulator, power management IC (PMIC), a filter, a switch, an amplifier, an interface, a repeater or retimer, a clock, a processor, a controller, an accelerator, a memory, a non-volatile memory (NVM), a cache, a bridge die, and a buffer; planarizing a front surface of the substrate core to form a frontside planar surface and expose at least a portion of the one or more embedded components; forming a first frontside conductive layer over the frontside planar surface, the first frontside conductive layer comprising one or more of traces, vias, lands, lines, pads, and planes configured for coupling to the at least one embedded component; disposing a first frontside layer of dielectric over the frontside planar surface, the at least one embedded component, and the first frontside conductive layer; rotating the substrate core about a long axis such that a back surface of the substrate core is configured for processing, and forming a first backside conductive layer comprising one or more of traces, vias, lands, lines, pads, and planes over the back surface of the substrate core.

Particular embodiments of the disclosure may further include one or more of the following features. Planarizing the back surface of the substrate core opposite the front surface to form a backside planar surface and expose at least a portion of the one or more embedded components. Disposing a first backside layer of dielectric over the back surface of the substrate core, over the at least one embedded component, and over the first backside conductive layer; planarizing the first backside layer of dielectric by grinding, chemical mechanical polishing (CMP), surface planarization, polishing, plasma etching, wet etching, or thinning by using a diamond-based cutter, to expose at least a portion of the first backside conductive layer to form a first backside planar surface on the first backside layer of dielectric; forming a second backside conductive layer comprising one or more of traces, vias, lands, lines, pads, and planes over the first backside planar surface, the second backside conductive layer configured to be electrically coupled to the first backside conductive layer; disposing a second backside layer of dielectric over the second backside conductive layer and the first backside planar surface; rotating the substrate core such that the first frontside layer of dielectric is configured for processing; planarizing the first frontside layer of dielectric to expose at least a portion of the first frontside conductive layer to form a first frontside planar surface on the first frontside layer of dielectric; forming a second frontside conductive layer comprising one or more of traces, vias, lands, lines, pads, and planes over the first frontside planar surface, the second frontside conductive layer configured to be electrically coupled to the first frontside conductive layer; disposing a second frontside layer of dielectric over the second frontside conductive layer and the first frontside planar surface; rotating the substrate core such that the second backside layer of dielectric is configured for processing, and planarizing the second backside layer of dielectric to expose at least a portion of the second backside conductive layer to form a second backside planar surface on the second backside layer of dielectric. The at least one tracking identifier comprises a 2-dimensional (2D) code, a laser mark, an ink mark, a data matrix code, an ecc200 code or a QR code, an inductor, an antenna, an RFID component, or a directional component. At least one of the frontside layers of dielectric and the backside layers of dielectric comprise mold compounds that are formed by a molding process. The mold compounds comprise at least one of a coefficient of thermal expansion (CTE) and a glass transition temperature (Tg) that are substantially the same as one another. At least one tracking identifier comprising a 2-dimensional (2D) code, a laser mark, an ink mark, a data matrix code, an ecc200 code or a QR code, an inductor, an antenna, an RFID component, or a directional component in or on at least one of the frontside and backside layers of dielectric. Reading the tracking identifier, removing the tracking identifier by planarizing, and reapplying the tracking identifier. Forming additional alternating layers of frontside conductive layers and backside conductive layers, interleaved with alternating frontside and backside layers of dielectric, to form up to 30 layers of frontside conductive layers and backside conductive layers, and up to 30 layers of frontside and backside dielectric layers. One or more tracking identifiers comprising a 2-dimensional (2D) code, a laser mark, an ink mark, a data matrix code, an ecc200 code or a QR code, an inductor, an antenna, an RFID component, or a directional component disposed in or on the alternating frontside and backside layers of dielectric. Reading the tracking identifier, removing the tracking identifier by planarizing, and reapplying the tracking identifier in or on the alternating frontside and backside layers of dielectric. Reading the at least one tracking identifier. Aat least one of the frontside conductive layers and the backside conductive layers are formed comprising a trace width in a range of about 0.5 um to about 2 μm and a space between traces in a range of about 1 μm to about 2 μm. At least one of the frontside conductive layers and the backside conductive layers are formed with vias having a diameter of about 0.75 μm to about 1.5 μm. One or more of the frontside layers of dielectric and the backside layers of dielectric comprises a mold compound, a composite material, such as epoxy resin with filler, epoxy acrylate with filler, polytetrafluoroethylene, a build-up film, a low k dielectric, a polyimide, and a polymer. One or more of the first frontside planar surface and the first backside planar surface are planarized to a surface roughness within 5 to 500 nanometers. Forming one or more of the first frontside conductive layer, the second frontside conductive layer, the first backside conductive layer, and the second backside conductive layer comprising one or more of power planes, a thermal delivery system, a power delivery system, a ground plane, and a shielding, comprising a shape including for inductors, passive components, antennas, and markings for identification. One or more of the alternating frontside and backside layers of dielectric comprises an outermost layer, wherein the outermost layer comprises polyimide (PI) disposed under at least a portion of an outermost frontside or backside conductive layer. At least one of the outermost frontside or backside conductive layers comprises pads for coupling to conductive interconnects of at least one peripheral device. The substrate core comprises a thickness in a range of 0.04 mm to 1 cm. Forming one or more of the first frontside conductive layers and the first backside conductive layers with unit specific patterning. The first frontside conductive layer or second frontside conductive layer comprises a first area, and the first backside conductive layer or second backside conductive layer comprises a second area, and the first area and the second area differ in an amount by area of less than or equal to 30%. Disposing a first tracking identifier on or in a front side of the substrate core, and disposing a second tracking identifier on a back side of the substrate core. Forming one or more of the frontside conductive layers and the backside conductive layers as a portion of an interconnect structure comprising unit specific patterning.

Aspects of this disclosure relate to a method of making an interconnect substrate, comprising forming a first frontside conductive layer over a front side of a substrate core, wherein the front side is planarized by grinding, chemical mechanical polishing (CMP), surface planarization, polishing, plasma etching, wet etching, or thinning by using a diamond-based cutter, and the substrate core comprises one or more of a dielectric, encapsulant, a resin, polymer, a printed circuit board (PCB), a PCB core, mold compound such as epoxy or a thermoset material; disposing a first frontside layer of dielectric over the front side of the substrate core and over the first frontside conductive layer; marking a surface of the first frontside layer of dielectric with at least one tracking identifier comprising one or more of a laser mark, an ink mark, a 2D code, a data matrix code, an ecc200 code or a QR code; rotating the substrate core such that a back side of the substrate core is configured for processing; and forming a first backside conductive layer over the back side of the substrate core.

Particular embodiments of the disclosure may include one or more of the following features. Disposing a first backside layer of dielectric over the back side of the substrate core and over the first backside conductive layer; planarizing the first backside layer of dielectric to expose at least a portion of the first backside conductive layer to form a first backside planar surface on the first backside layer of dielectric; forming a second backside conductive layer over the first backside planar surface; disposing a second backside layer of dielectric over the second backside conductive layer and the first backside planar surface; rotating the substrate core such that the first frontside layer of dielectric is configured for processing; and planarizing the first frontside layer of dielectric to expose at least a portion of the first frontside conductive layer to form a first frontside planar surface on the first frontside layer of dielectric. Forming additional alternating frontside and backside conductive layers with additional frontside and backside layers of dielectric up to 30 layers of frontside and backside dielectric layers. Forming one or more tracking identifiers comprising a 2-dimensional (2D) code, a laser mark, an ink mark, a data matrix code, an ecc200 code or a QR code, an inductor, an antenna, an RFID component, or a directional component in or on one or more of the alternating frontside and backside layers of dielectric. Marking the additional frontside and backside layers of dielectric with the tracking identifier; reading the tracking identifier; removing the tracking identifier by planarizing, and reapplying the tracking identifier. Planarizing the additional frontside and backside layers of dielectric to a surface roughness within 5 to 500 nanometers.

BRIEF DESCRIPTION OF THE DRAWINGS

Implementations will hereinafter be described in conjunction with the appended drawings, where like designations denote like elements, and.

DETAILED DESCRIPTION

Figures 1A, 1B, 1C:
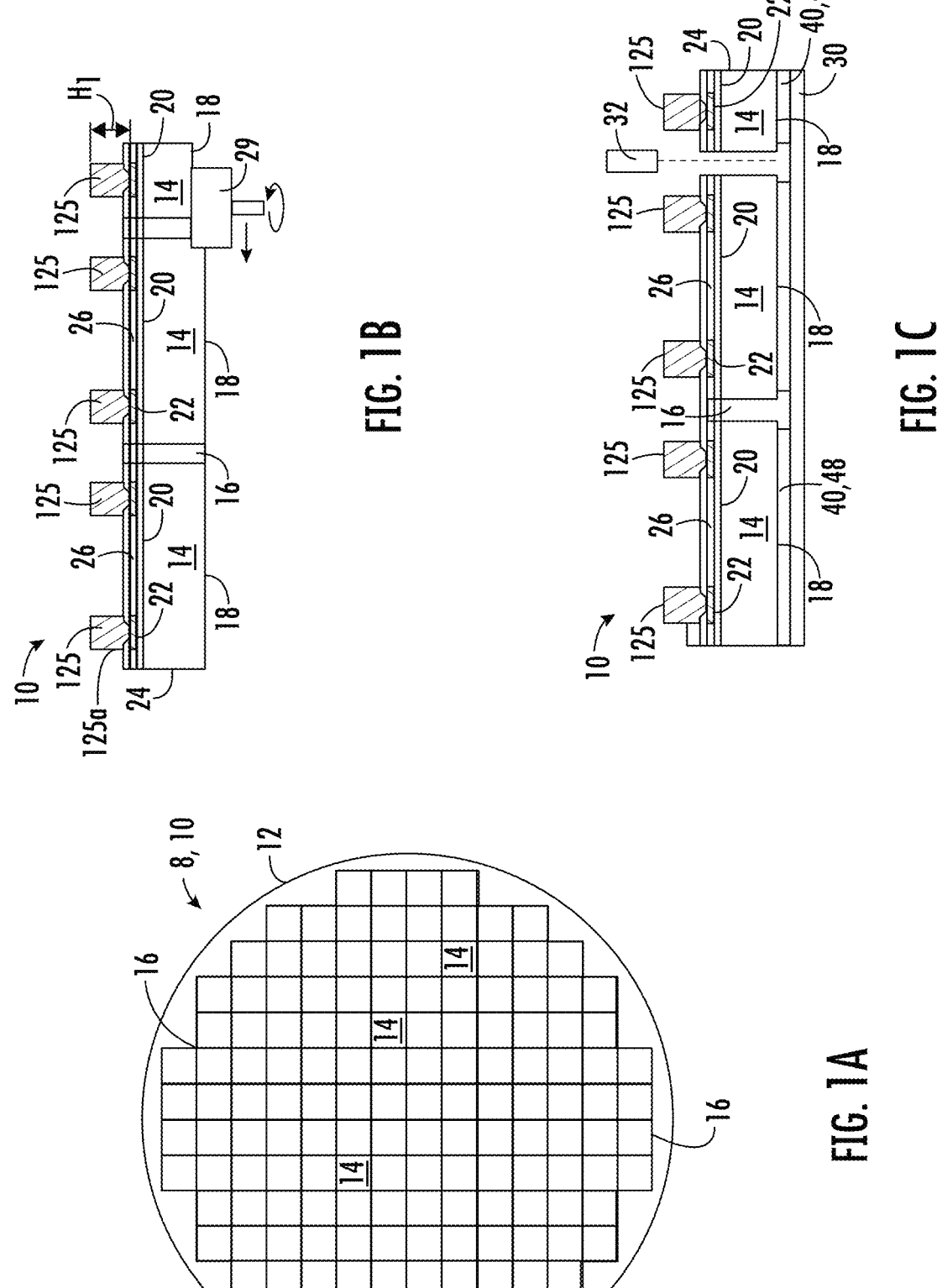
FIGS. 1A-1C are illustrations of components comprising electrical interconnects being singulated from a substrate or native wafer.

Detailed aspects and applications of the disclosure are described below in the following drawings and detailed description of the technology. Unless specifically noted, it is intended that the words and phrases in the specification and the claims be given their plain, ordinary, and accustomed meaning to those of ordinary skill in the applicable arts.

The singular forms "a," "an," and "the" include plural referents unless the context clearly dictates otherwise. Thus, for example, reference to "a step" includes reference to one or more of such steps.

When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

Throughout the description and claims of this specification, the words "comprise" and "contain" and variations of the words, for example "comprising" and "comprises", mean "including but not limited to", and are not intended to (and do not) exclude other components.

As required, detailed embodiments of the present disclosure are included herein. It is to be understood that the disclosed embodiments are merely exemplary of the invention that may be embodied in various forms. Therefore, specific structural and functional details disclosed herein are not to be interpreted as limits, but merely as a basis for teaching one skilled in the art to employ the present invention. The specific examples below will enable the disclosure to be better understood. However, they are given merely by way of guidance and do not imply any limitation.

The present disclosure may be understood more readily by reference to the following detailed description taken in connection with the accompanying figures and examples, which form a part of this disclosure. It is to be understood that this disclosure is not limited to the specific materials, devices, methods, applications, conditions, or parameters described and/or shown herein, and that the terminology used herein is for the purpose of describing particular embodiments by way of example only and is not intended to be limiting of the claimed inventions. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the inventions. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

This disclosure relates to interconnect substrates, molded direct contact interconnect substrates, molded substrates, and build-up structures comprising one or more dielectric layers (hereinafter referred to as "interconnect substrates"), such as for use with semiconductor structures, devices, and packages. In some instances, the interconnect substrates may comprise one or more dielectric layers of polymer, mold compound, or build-up substrates coupled with one or more conventional substrates. The interconnect substrate may include routing for semiconductor devices comprising different pitches.

Interconnect substrates also provide other advantages, including the formation of custom and use specific substrates, providing additional design options when being used with (or stacked on, in, or between) conventional substrates (such as circuit boards, printed circuit boards (PCBs) (whether single layer, double layer, multi-layer, high density interconnect (HDI), high frequency, formed with a core, with or without a mesh or glass weave reinforcement, rigid, flexible, rigid-flex, laminates, interposers, or any other substrate or support material). The interconnect substrates, having the features as disclosed herein, remove the need for interposers, which are typically formed individually and disposed within the package or assembly to provide for higher density routing and (or) functionality. Using the methods as disclosed herein, an interconnect substrate may be formed which provides high density routing and enhanced features within the substrate, thereby making the use of an interposer unnecessary or optional.

Interconnect substrates further provide the additional advantages of conductive layers within the substrate being formed as more features within the interconnect substrate (e.g. more than copper or conductive posts), and further include: (i) vertical conductive contacts or vertical conductive interconnects, stump layers, thermal planes, power planes and power delivery systems, (ii) shielding for all or part of the interconnect substrate (such as when shielding is only for part of the interconnect substrate, the shielding may be targeted for high energy, high frequency, RFID, or for other application specific needs or operations), and (iii) patterned metal in any shape, including for inductors, antenna, markings for identification, such as part number, manufacture date or location, or other desired information. U.S. Pat. No. 11,973,051, issued Apr. 30, 2024, to Davis et. al., entitled "Molded Direct Contact Interconnect Structure without Capture Pads and Method for the Same", is incorporated herein by this reference in its entirety and relates to interconnect substrates, their manufacturing methods and structures.

Other features may also (but need not be) be formed within, adjacent, above, or below the interconnect substrate, including passive devices, integrated passive devices (IPDs), molded components, or other features included with the interconnect substrate. Molded components may comprise embedded devices, active devices, a semiconductor chip comprising an active layer, an IPD, or a passive device, silicon devices, integrated circuits, bridge chips or bridge die, inductors, capacitors, and resistors, for power management, RF signal processing, clocking or devices for other functions. In some embodiments, components 14 may also comprise one or more TSVs 27 (as shown in FIG. 2H). The TSVs 27 may extend from the front or active surface 20 to the backside 18 of the component 14 to provide through vertical interconnection. In some instances, the interconnect substrate will be formed without any molded components. Without molded components the interconnect substrate (or portions thereof) may operate more as a conventional substrate or PCB and include conductive features for routing of electrical signals, the conductive features being formed as one or more studs, interconnects, routing layers, and redistribution layers.

At least some of the above advantages are available at least in part by using unit specific patterning (such as patterning or custom lithography) to form interconnect structures or build-up interconnect structures such as a frontside interconnect structure, which is also known under the trademark "Adaptive Patterning," referred to as "AP." Unit specific patterning: (i) allows for the use high-speed chip attach for semiconductor chip and AP will ensure alignment for high density interconnects with the interconnect structures; and (ii) allows for automated optical inspection (AOI) and defect identification with the possibility for defect repair, which may include laser direct imaging (LDI) and plating for opens and may further include laser cut for shorts.

This disclosure, its aspects and embodiments, are not limited to the specific package types, material types, or other system component examples, or methods disclosed herein. Many additional components, manufacturing and assembly procedures known in the art consistent with semiconductor wafer fabrication, manufacture and packaging are contemplated for use with particular implementations from this disclosure. Accordingly, for example, although particular implementations are disclosed, such implementations and implementing components may comprise any components, models, types, materials, versions, quantities, or the like as is known in the art for such systems and implementing components, consistent with the intended operation.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

In the following description, reference is made to the accompanying drawings which form a part hereof, and which show by way of illustration possible implementations. It is to be understood that other implementations may be utilized, and structural, as well as procedural, changes may be made without departing from the scope of this document. As a matter of convenience, various components will be described using exemplary materials, sizes, shapes, dimensions, and the like. However, this document is not limited to the stated examples and other configurations are possible and within the teachings of the present disclosure. As will become apparent, changes may be made in the function, arrangement, or both of any of the elements described in the disclosed exemplary implementations without departing from the spirit and scope of this disclosure.

FIGS. 1A-1C following are illustrations of components comprising electrical interconnects being singulated from a substrate or native wafer.

FIG. 1A shows a plan or top view of a substrate 8, which may comprise a semiconductor wafer or native wafer 10 with a base substrate material 12, such as, without limitation, silicon, silicon dioxide, silicon carbide, germanium, gallium arsenide, indium phosphide, gallium nitride, silicon nitride, silicon carbide, or other semiconductor material for the base material or structural support. A plurality of components or semiconductor components 14 can be formed on wafer 10 and can be separated by a non-active, inter-component wafer area or saw street 16 as described above. The saw street 16 can provide cutting areas to singulate the semiconductor wafer 10 into the individual component 14. In other instances, integrated passive devices (IPDs), either passive or active bridge chips, or other suitable devices that become embedded devices can be formed on a substrate 8 formed of glass, ceramic, or other suitable material for providing structural support for subsequent processing.

Each component 14 may comprise one or more active devices, passive devices, or both active devices and passive devices. In some instances, the component 14 may be formed without active and passive devices, and be used for transmission or routing, such as by comprising TSVs for vertical interconnect. For example, the component 14 may be formed as a bridge chip with only electrical routing and with copper studs of the semiconductor chip electrically connected or coupled with wiring, routing, or RDL to the bridge chip. The component 14 may also be only a dummy substrate with no electrical function, but rather act as structural element and may or may not include copper studs. In some instances, the component 14 may not include, and may be formed without, conductive studs. In instances where the component 14 does not include conductive studs, bond or contact pads 22 on the component 14 may comprise a conductive layer having an increased thickness to avoid damage to the component 14, such as from laser processing to expose the contact pads 22 from overlying polymer or encapsulant layers.

Component 14 may comprise semiconductor chips and semiconductor die that comprise a backside or back surface 18, an active layer 20 and an outermost, front surface opposite the backside 18. In some instances, both the active layer 20 and the backside or back surface 18 of the component 14 may be active. In any event, the component contains one or more analog, or digital circuits, diodes, or transistors implemented as active devices, conductive layers, and dielectric layers formed within or on the chip and electrically interconnected according to the electrical design and function of the semiconductor chip and may comprise a processor or logic device. In some instances, passive devices may also be integrated as part of the semiconductor chip or semiconductor die. The component 14 may comprise circuits that may include one or more transistors, a FET, a JFET, a MOSFET, a BJT, an IGBT, a SIT, a Schottky transistor diodes, and other circuit elements formed within the chip substrate and close to the front surface to implement analog circuits or digital circuits, such as DSP, ASIC, memory, or other circuits. Circuits may include RF circuits, LED, LCOS, CIS, transistor, optoelectronic, MEMS and the like. The component 14 may also contain IPDs such as inductors, capacitors, and resistors, for RF signal processing, digital or analog power line control or other functions. The component 14 may be formed on a native wafer. In some instances, a wafer level process may be used to produce many packages simultaneously on a carrier. In other instances, the package may be formed as part of a reconstituted wafer and may comprise multiple components or chips molded together.

FIG. 1B illustrates a cross-sectional view of a portion of semiconductor wafer 10 having a thickness, t. Each component 14 is shown formed of base substrate material 12 and comprising a backside 18 or back surface, an active layer 20 and a front surface 21, opposite the backside 18.

An electrically conductive layer or contact pads 22 is formed over active layer 20 using PVD, CVD, electrolytic plating, electroless plating process, or other suitable metal deposition process. Conductive layer or contact pads 22 can be one or more layers of aluminum (Al), Titanium (Ti), copper (Cu), tin (Sn), nickel (Ni), gold (Au), palladium (Pd), silver (Ag), cobalt (Co), platinum (Pt), or other suitable electrically conductive material. Conductive layer 22 operates as contact pads or bond pads electrically coupled or connected to the circuits, transistors, or diodes in the semiconductor substrate 10 near front surface 21. The conductive layer can be formed as contact pads 22 disposed side-by-side a first distance from an edge 24 of component 14, as shown in FIG. 1B. Alternatively, conductive layer can be formed as contact pads 22 that are offset in multiple rows such that a first row of contact pads 22 is disposed a first distance from the edge 24 of the component 14, and a second row of contact pads 22 alternating with the first row is disposed a second distance from the edge 24 of the component 14. In other instances, the component 14 can comprise digital chips, analog chips, or RF chips (or other chips) with more than two rows of contact pads and may further comprise contact pads 22 over the whole surface of the chip that do not follow a full grid pattern. Other components 14 may have contact pads in an array over the whole surface of the chip.

FIG. 1B also illustrates the semiconductor substrate 10 and components 14 can undergo an optional grinding operation with grinder 29 to reduce a thickness of the semiconductor substrate 10 and component 14 to form a component 14 having a thickness which has been reduced. Other methods to reduce the thickness of the semiconductor substrate 10 such as plasma etching or wet etching, as an alternative to, or in combination with, the optional grinding operation may be used and selection of the thinning process may depend on which base substrate material 12 the component 14 is made from.

FIG. 1B further shows one or more optional insulating, passivating, or dielectric layers 26 which may be conformally applied over active layer 20 and over conductive layer comprising contact pads 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), carbon-doped silicon dioxide, silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having suitable insulating and structural properties. When insulating layer 26 is formed over conductive layer comprising contact pads 22, openings are formed completely through insulating layer 26 to expose at least a portion of conductive layer for subsequent mechanical and electrical interconnection using contact pads 22. In alternate embodiments, insulating layer 26 includes a passivation layer and conductive layer comprising contact pads 22 may be formed atop the insulating layer 26. In such an embodiment, no openings in the insulating layer 26 over contact pads 22 would be necessary. In some embodiments, insulating layer 26 includes a passivation layer forming front surface 21. In other embodiments where the conductive layer comprising contact pads 22 is not covered by insulating layer 26, the outermost, front surface may comprise the conductive layer.

FIG. 1B shows conductive studs or electrical interconnect structures 125 can be formed as conductive studs, bumps, thick pads, columns, pillars, posts, or conductive studs and are disposed over, and coupled or connected to, contact pads 22. The conductive studs 125 can be formed directly on contact pads 22 using patterning and metal deposition processes such as screen printing, PVD, CVD, sputtering, electrolytic plating, electroless plating, evaporation, or other suitable metal deposition process. Alternately, conductive studs 125 may be formed in a position not vertically over the contact pads 22 and connected by RDL. Conductive studs 125 can be one or more layers of Al, Cu, Sn, Ni, Au, Ag, W, palladium (Pd), or other suitable electrically conductive material and can include one or more UBM layers. In an embodiment, a photoresist layer can be deposited over component 14 and contact pads 22. A portion of the photoresist layer can be exposed and removed by a developing or other suitable process. Electrically conductive studs 125 can then be formed as pillars or other structures as previously described in the removed portion of the photoresist and over contact pads 22 using a plating process. In some embodiments, copper may be used in a plating process. The photoresist layer and other appropriate layers, such as a seed layer, can be removed leaving conductive studs 125 that provide for subsequent mechanical and electrical interconnection and a standoff with respect to active layer 20 and insulating layer 26 if present. In some instances, the conductive studs 125 include sides, side walls or side surfaces 125a, and a height, H1, in a range of 3-100 micrometers (μm), 5-50 μm, 10-40 μm, or about 25 μm. In some instances, the height $H_1$ of the conductive stud 125 may be less than 5 μm or less than 3 μm.

A conductive stud is a conductive interconnect structure that may have generally vertical sides and may be wider than it is tall, built-up on a substrate, such as over an active layer of a chip, polyimide, encapsulant or mold compound. A conductive stud, though typically formed of the same materials as a pillar or post would be formed, may differ from a pillar or post, each of which may have a height greater than its width. A conductive stud, though it is commonly formed in a cylindrical shape, may be formed with a cross-sectional area that is circular, oval, octagonal, or as any polygonal or other shape and size. Another use for a conductive stud is as a dummy thermal conductive stud that is not electrically coupled to an active electrical circuit but is instead thermally coupled to a heat source of an active device to conduct or dissipate the heat to another structure, such as to a die pad on a surface of the component 14. The generally vertical sides of a conductive stud 125 are different from the sides shape that exists for a solder ball or a compressed or outwardly deformed solder ball that has generally rounded sides. The generally vertical nature of a conductive stud 125 comes from being formed in a structure that has been previously developed or etched, such as within openings in a photoresist layer, which will also be generally vertical, although it may comprise imperfections or irregularities in shape that result from the etching process, the photoresist material, or other materials and processes used. For example, developing or etching does not generally perfectly or uniformly remove the photoresist within the openings, and therefore forms imperfect, generally vertical openings for deposition of conductive materials for the conductive stud 125. The term "generally vertical" as used herein includes perfectly vertical and imperfectly vertical sides. A conductive stud is not a wire bond and is not solder.

FIG. 1C further illustrates an optional adhesive or a (chip) die attach film (DAF) or material 30 may be attached to the back surface 18 of the semiconductor substrate or wafer 10, such as for subsequent mounting on a carrier. In some embodiments, semiconductor substrate or wafer 10 may comprise a pre-applied backside metal 48 applied as one-step of a wafer fabrication process. In other instances, a conductive backside material 40 may be applied according to the methods further disclosed herein. FIG. 1C also illustrates wafer 10 can be singulated with a saw or wafer cutting tool 32 into individual components 14 (later embedded components 14) through saw streets 16 using a saw blade or laser cutting tool or plasma dicing tool or laser stealth dicing process or a scribe and break process. In some instances, the components 14 will have a thickness, t of between about 10 μm to about 300 μm for thin ground wafers, and about 10 μm to about 800 μm for thick ground wafers. In other instances, the components 14 will have a thickness of between about 20 μm to about 200 μm for thin ground wafers, and about 100 μm to about 700 μm for thick ground wafers. In further instances, the wafer 10 may not be subjected to backgrinding and may comprise a full thickness, t, of from about 760 to 800 μm, or about 780 μm for a wafer 10 having a diameter of 300 mm.

While FIGS. 1B and 1C and others following depict conductive studs 125, in other embodiments, components 14 may not comprise conductive studs 125.

Figure 2A:
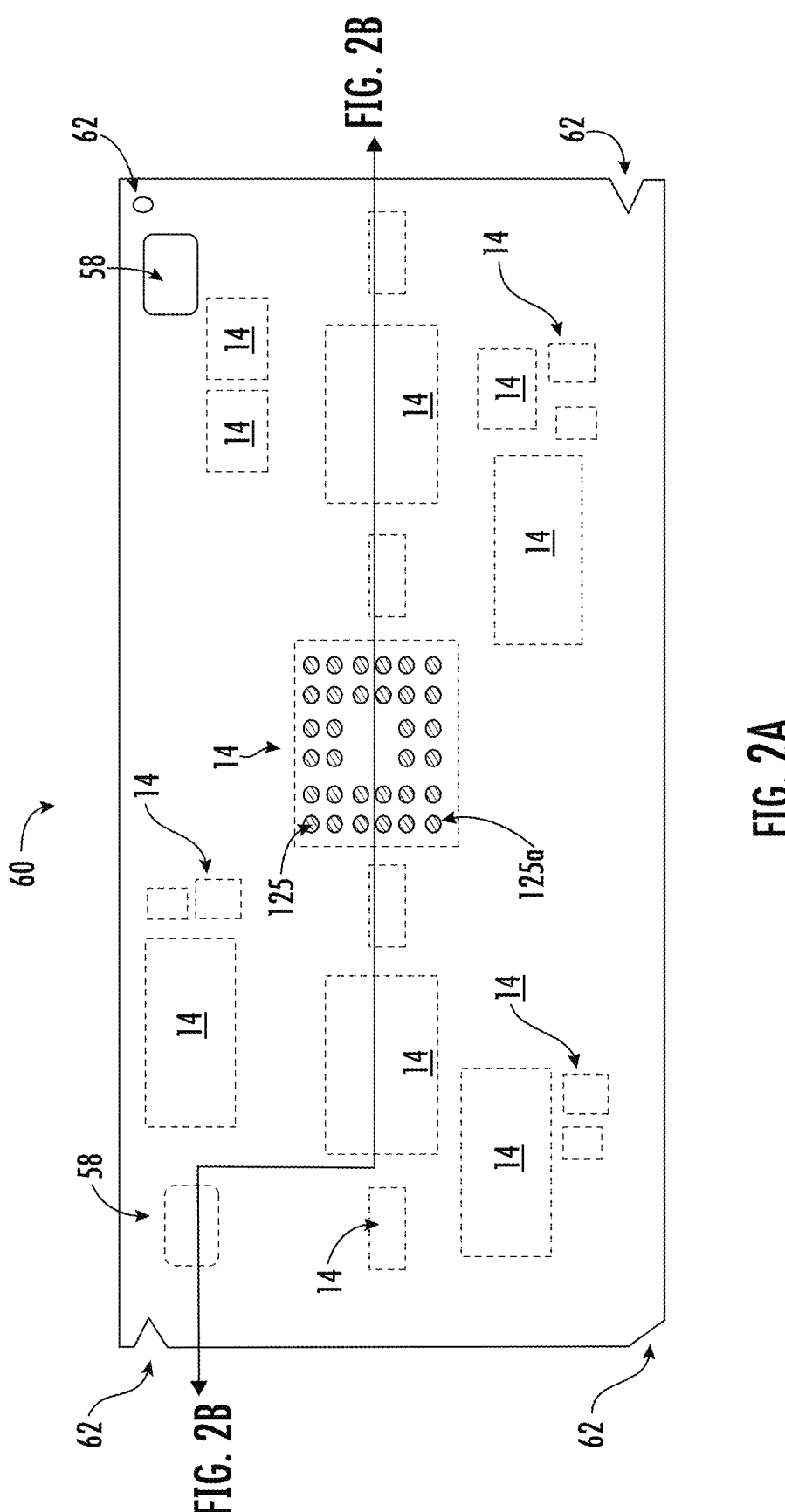
FIG. 2A depicts a substrate core comprising embedded components disposed therein.

FIG. 2A illustrates providing a substrate core, base, substrate base, panel or substrate panel 60 having alignment features 62 disposed therein. While not shown in every FIG., it is understood that alignment features 62 may be present but not shown for simplicity. According to some embodiments, the substrate core 60 may comprise one or more of a dielectric, an encapsulant, ceramic, glass, a glass fiber woven material or core, layers of glass fiber, a glass reinforced epoxy material such as FR4, composite epoxy material (CEM), plastic, polymer, mold compound such as epoxy or a thermoset material, a printed circuit board (PCB) with or without routing, a PCB core, metal, silicon, fiberboard, layers of paper laminated with epoxy or phenolic resin, carbon fiber, and composite material such as a carbon composite. As used herein FR4 further comprises any suitable Flame Retardant PCB material such as FR1, FR2 or FR3; and similarly, the CEM in some embodiments may comprise CEM1, CEM2 or CEM3. In some embodiments, the substrate core 60 may comprise a thickness in a range of 0.04 mm to 1 cm, from 0.040 mm to 5 mm, or about 0.075 mm. According to additional embodiments, the substrate core 60 may comprise a coreless substrate having a thickness of from 0.040 mm to 3 mm, or about 0.050 mm. In an embodiment, the substrate core 60 may comprise at least one embedded component 14 comprising at least one of a semiconductor chip or semiconductor device, a chiplet, an active device or active component, an integrated circuit (IC), a passive device, an integrated passive device (IPD), a deep trench capacitor (DTC), a transformer, a voltage regulator, power management IC (PMIC), a filter, a switch, an amplifier, an interface, a repeater or retimer, a clock, a processor, a controller, an accelerator, a memory, a non-volatile memory (NVM), a cache, a bridge die, and a buffer. The embedded component 14 may in some instances, comprise a double-sided bridge die comprising through silicon vias (TSVs). FIG. 2A also illustrates in plan view conductive studs, electrical interconnect structures, conductive interconnects, or conductive bumps 125 that can be formed as columns, pillars, posts, thick RDLs, bumps, or studs that are formed of copper or other suitable conductive material, which are disposed over, and electrically coupled or connected to, embedded components 14. Conductive studs 125 may comprise sides, side surfaces or sidewalls 125a. Sides 125a of the conductive studs 125 may directly contact the substrate core 60.

FIG. 2A further shows where in some embodiments the substrate core 60 may comprise at least one alignment feature 62 disposed on a surface of, or through, the substrate core 60 or at an edge or around a periphery of substrate core 60. Alignment feature 62 may comprise a notch, a hole, a semicircle, a groove, text or other ink or laser mark, or any type of identifiable alignment feature incorporated into substrate core 60 which may be used as a location reference for subsequent alignment of substrate core 60 (or alignment of optional carrier 84 when used) during processing.

Still referring to FIG. 2A, according to some embodiments, substrate core 60 may comprise one or more tracking identifiers 58. Tracking identifiers 58, 58a, 58b may comprise a device, such as an inductor, antenna, RFID component, RFID tag, and in further embodiments tracking identifiers 58, 58c, may comprise a mark, such as a 2-dimensional (2D) code, a laser mark, an ink mark, a data matrix code, an ecc200 code, a QR code, or other, various types of directional components able to be read by an interrogator or similar device, such as an RFID reader. The tracking identifier 58 may be read or interrogated by the reader, which is connected to a computing device that records the position, processing, and history of the substrate core 60 to verify different processes and their completion and ensure manufacturing consistency. In some instances, the position or orientation of the substrate core or panel 60 may be determined by positioning the tracking identifier 58 proximal to, or on a surface of, the substrate core 60 and measuring the signal strength from the tracking identifier 58 to the interrogator, where a stronger signal is measured when the tracking identifier 58 is nearer to the interrogator. In further instances, one or more tracking identifiers 58 may be disposed in any, all, or one or more of, the dielectric layers 130, 140, as part of interconnect structures 120, 150, as shown and described following, and the tracking identifier 58 may be read or interrogated by the reader as described. The interrogator can measure the orientation in three dimensional space of the substrate core 60 and transmit the position and processing information to the computing device, which stores a previous orientation in memory, and compares a previous orientation to a present orientation to track the position of the substrate core 60 in three dimensional space during processing. In so doing, the tracking identifier 58 retains processing information such as the number of iterations of a given process applied to the substrate core 60. For example, if substrate core 60 is subject to a rotation about a long axis, the tracking identifier may count that rotation at a first instance, and a second rotation as part of a second rotational process may be added to the count according to a series of manufacturing processes. For ease of readability through multiple dielectric or encapsulant layers, substrate core 60 may comprise a tracking identifier 58, which may comprise a first tracking identifier 58a disposed on or within a back side 66, 66a of the substrate core 60, rotating the substrate core, and disposing a second tracking identifier 58, 58b on or over a front side 64, 64a of the substrate core 60, as depicted in FIG. 2E. A person of ordinary skill in the art (POSA) would understand that a similar, or the same process as described for the substrate core 60 as in FIG. 2E would also apply to subsequently applied dielectric or encapsulant layers having one or more tracking identifiers disposed therein. Tracking identifier 58 may comprise any of, or a plurality of a 2-dimensional (2D) code, a laser mark, an ink mark, an inductor, an antenna, an RFID component, or a directional component. According to some embodiments, the tracking identifier comprising the 2D code, the lasermark or the ink mark may be formed on a surface of the substrate core 60 and read by a reader or detector, removed by grinding or planarizing the dielectric or encapsulant layer, and reapplied in a same or different manner than originally applied to create a new, unique tracking identifier 58d, 58e, etc. for use in subsequent processing and within layers subsequently formed. In some instances, more than one tracking identifier 58 may be laterally offset from one another across substrate core 60, as seen in FIG. 2A, such that readers or interrogators may be positioned during manufacturing to read a specific tracking identifier at a specific distance from the substrate core 60, as the substrate is rotated during processing.

Figure 2B:
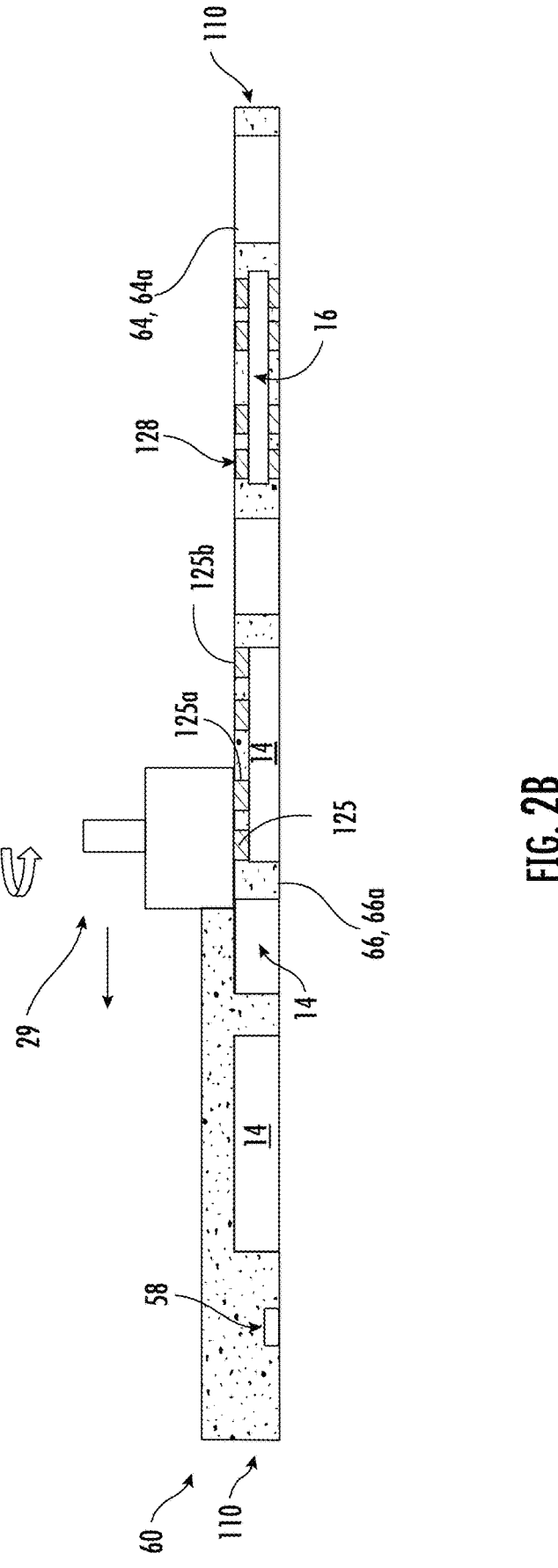
FIG. 2B shows a cross sectional view of the related section line of FIG. 2A.

FIG. 2B shows a cross-sectional view of the related section line of FIG. 2A, depicting substrate core 60 having a front side or front surface 64 and a back side or back surface 66 of the substrate core 60 opposite the front side, and tracking identifier 58 disposed therein. An embedded component 14 is further shown disposed within substrate core 60, the embedded component 14 comprising conductive studs 125 having sides 125a, disposed over front surface, active layer or active surface 20 of the embedded component 14. In some instances, the embedded component 14 may comprise a power transistor 16 disposed in substrate core 60 and having conductive interconnects 128 coupled thereto and exposed for electrical interconnection. Conductive interconnects 128 may be the same or similar as conductive interconnects 125. A POSA would understand that any number and types of components 14 may be disposed within or over substrate core 60. In some instances, at least one surface (such as front side 64, back side 66, or both) of the substrate core 60 may be planarized or ground using grinder 29 by grinding, chemical mechanical polishing (CMP), surface planarization, polishing, plasma etching, wet etching, or thinning by using a diamond-based cutter to create a uniformly flat, planarized surface 64a, 66a, etc. on which to form additional structures. Depositing a material over an existing pattern, or over or around embedded components 14, can exaggerate the underlying, existing pattern or embedded components 14, and create a non-uniformly flat surface. A uniformly flat surface can be beneficial or required to produce smaller and more densely packed active and passive components. Planarization can be used to remove material from a surface of the substrate core 60 and produce a uniformly flat surface. Planarization involves polishing the surface of the substrate core 60 with a polishing pad. An abrasive material and corrosive chemical may in some instances be added to the surface of the substrate during polishing. Alternatively, mechanical abrasion without the use of corrosive chemicals may be used for planarization. In some embodiments, purely mechanical abrasion is achieved by using a belt grinding machine, a standard wafer backgrinder, or other similar machine. In a CMP process, the combined mechanical action of the abrasive and corrosive action of the chemical removes any irregular topography, resulting in uniformly flat, planarized surfaces, such as planarized surfaces 64a, 66a and the like, formed over surfaces of the substrate core 60. The planar surfaces 64a over front side 64, and 66a over back side 66 of the substrate core 60, may comprise a roughness less than 500 nanometers (nm) over a characteristic measurement distance. The characteristic measurement distance may be a distance great enough to characterize the roughness, such as to a generally accepted level of certainty, and in some instances could be a distance of three times the distance over which the roughness measurements are taken. The planarizing or grinding of the substrate core 60 produces a flatness of within a range of about 0.5-5 micrometers and a total roughness height from peak to valley measured over a characteristic measurement distance of 1 millimeter (mm) length of between 5 and 500 nanometers (nm). While conventional encapsulant grinding might be done with less flatness, greater accuracy and precision can be obtained by using integrated sensors such as laser, acoustic, or other non-contact methods to control the grinding resulting in better flatness. In some embodiments, planarizing the substrate core 60 may comprise any combination of the above-referenced processes such as for example a grinding process followed by a surface planarization process. In some instances, the planar surfaces 64a, 66a, may also comprise ends, planarized ends, or exposed ends 125b, of the conductive studs 125 according to the aforementioned planarization processes. In the embodiments of FIGS. 2B-2E and 2H, a mold compound 110 is depicted as forming the substrate core 60, however other materials, such as dielectrics 130, 140, an encapsulant, ceramic, glass, a glass fiber woven material or core, layers of glass fiber, a glass reinforced epoxy material such as FR4, composite epoxy material (CEM), plastic, polymer, mold compound such as epoxy or a thermoset material, a printed circuit board (PCB) with or without routing, a PCB core, metal, silicon, fiberboard, layers of paper laminated with epoxy or phenolic resin, carbon fiber, and composite material such as a carbon composite, may be used, while not shown for simplicity.

FIGS. 2C-2H illustrate non limiting exemplary embodiments of a substrate core comprising a mold compound or encapsulant 110, FR4 or a woven or reinforced material 118, and alignment features 62 formed in a surface, at a perimeter, or through, the substrate core 60, with tracking identifiers 58, 58a disposed in or over the substrate core.

Figure 2C:
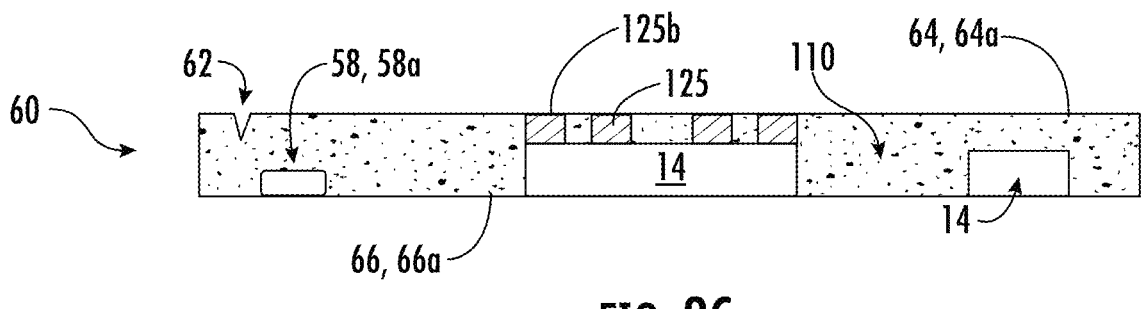
FIGS. 2C-2H illustrate embodiments of a substrate core as disclosed herein.

FIG. 2C shows an embodiment where the substrate core 60 may comprise a dielectric, an encapsulant or mold compound 110 may be formed by a molding or encapsulation process. According to some embodiments as shown in FIG. 2C, the substrate core may comprise one or more embedded components 14 having conductive studs 125 disposed thereon. A planarization process may be performed to create planarized surface 64a and form exposed, planarized ends 125b of the conductive interconnects or studs 125. Embedded components 14 may comprise at least one of a semiconductor chip or semiconductor device, a chiplet, an active device or active component, an integrated circuit (IC), a passive device, an integrated passive device (IPD), a deep trench capacitor (DTC), a transformer, a voltage regulator, power management IC (PMIC), a filter, a switch, an amplifier, an interface, a repeater or retimer, a clock, a processor, a controller, an accelerator, a memory, a non-volatile memory (NVM), a cache, a bridge die, and a buffer. More than one embedded component 14 is depicted in FIG. 2C. Further shown by FIG. 2C is tracking identifier 58 (which may comprise first tracking identifier 58a when used on both sides of substrate core 60), disposed in dielectric or mold compound 110.

Figure 2D:
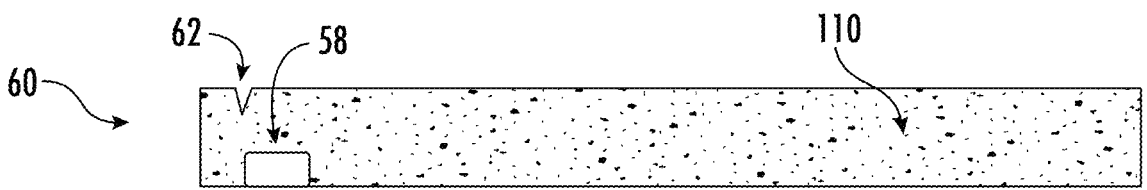
Figure 2E:
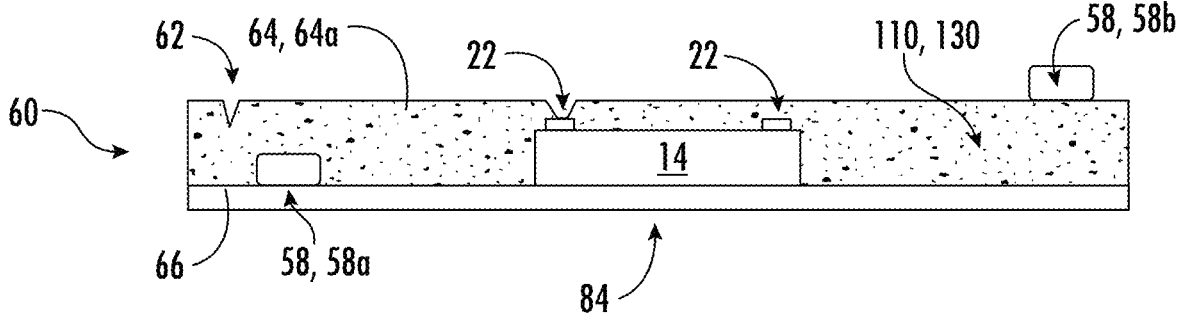

FIG. 2D illustrates a substrate core 60 similar to as shown for FIG. 2C, comprising an encapsulant 110 formed by a molding or encapsulation process but where the substrate core 60 does not comprise embedded components 14 and includes tracking identifier 58, 58a.

FIG. 2E shows an embodiment of a substrate core 60 comprising a dielectric 130 or an encapsulant 110 formed by a molding or encapsulation process as disclosed for FIGS. 2C and 2D, where the substrate core 60 comprises at least one alignment feature 62 disposed in or on encapsulant 110. In some embodiments, the substrate core 60 may not comprise an alignment feature 62, and instead a tracking identifier 58 is disposed in or on a dielectric 130, 140, and (or) an encapsulant or mold compound layer 110 as disclosed following. As shown in FIG. 2E, the method of making an interconnect substrate may comprise disposing a first tracking identifier 58, 58a on a back side 66, 66a of the substrate core 60 and disposing a second tracking identifier 58, 58b on a front side 64, 64a of the substrate core 60. Any of the tracking identifiers 58, 58a, 58b as aforementioned may be disposed on a surface of either side of substrate core 60, below the surface of either side of substrate core 60, or generally located proximal to surfaces of either side of the substrate core 60 to simplify reading of tracking identifiers 58, 58a, 58b and any additional tracking identifiers disposed in subsequently formed layers. A POSA would understand that additional tracking identifiers 58 . . . to 58n may be similarly disposed in subsequent frontside dielectric layers 130 as part of first interconnect structure 120, and backside dielectric layers 140 as part of second interconnect structure 150, as well as in or over substrate core 60, as shown and described for at least FIGS. 5A and 5B following.

As illustrated by FIG. 2E, in some instances where component 14 does not comprise conductive studs 125, electrical contact to component 14 may be achieved by laser drilling vias through dielectric 130 or mold compound 110 comprising a portion of substrate core 60 to expose bond pads 22, and sputtering or electroless plating and (or) plating or electroplating conductive layers thereon. FIG. 2E further illustrates where the method comprises using an optional carrier 84 during processing to provide additional support to the substrate core 60.

Figure 2F:
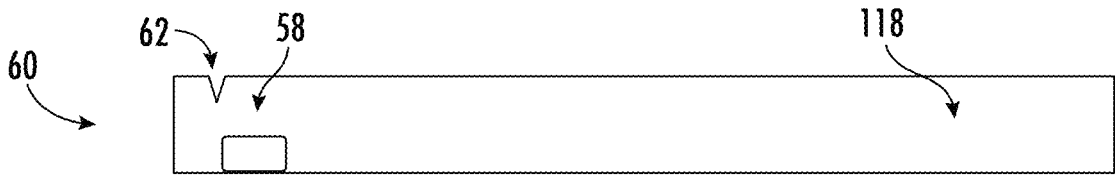
Figures 2G, 2H:
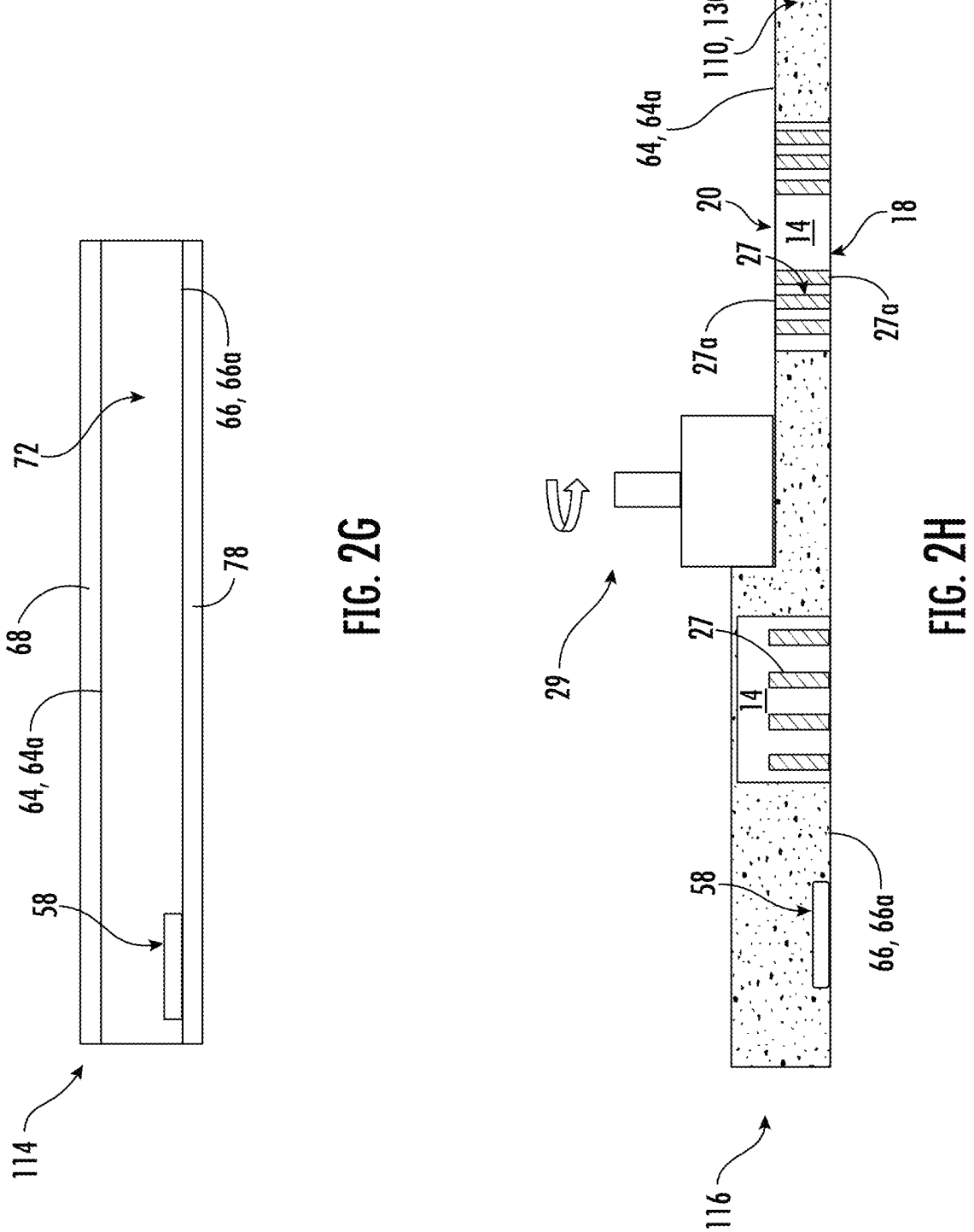

FIG. 2F depicts an embodiment of a substrate core 60 comprising a reinforced or woven material such as FR4 118 having tracking identifier 58 disposed therein. In some embodiments, the substrate core 60 comprising a woven material 118 may further comprise an embedded component 14 (as shown in FIG. 2C), and in other embodiments, substrate core 60 comprising FR4 118 may be formed without an embedded component 14.

As shown by FIG. 2G, in some embodiments, substrate core 114 may comprise a copper clad laminate (CCL) which may be patterned and processed similar to other embodiments as disclosed herein. In some instances, substrate core 114 may comprise a CCL core 72 comprising a glass fiber woven material, a resin, a glass reinforced epoxy material, a prepreg material (comprising fiberglass, paper or other cellulose fiber or carbon fibers or fabrics pre-impregnated with a resin, providing a uniform and strong substrate core for processing). In some embodiments, the CCL core 72 may comprise one or more tracking identifiers 58, 58*a*, 58*b*, etc. disposed therein as similarly previously disclosed for FIG. 2E.

In some embodiments as shown in FIG. 2H, a substrate core 116 may include at least one double sided bridge die or embedded component 14 comprising through silicon vias (TSVs) 27 or a vertical interconnect block such as is shown and described in U.S. patent application Ser. No. 19/218,116 titled MOLDED BRIDGE WITH VERTICAL INTERCON-NECTS AND METHOD OF MAKING THE SAME to Bishop et al., filed May 23, 2025. FIG. 2H illustrates an instance of an embedded component or double-sided bridge die 14 comprising TSVs 27 extending through the embedded bridge die or component 14, the TSVs 27 exposed at the front or active surface 20 and the backside 18 of the component 14 to provide through vertical interconnection to additional conductive layers. In some instances, the embedded component 14 comprising the double sided bridge die may be background or planarized, with mold compound 110 or dielectric 130, to expose and planarize one or more of opposing ends of the TSVs 27 by grinding, chemical mechanical polishing (CMP), surface planarization, polishing, plasma etching, wet etching, or thinning by using a diamond-based cutter to form opposing, planarized ends 27*a*. The embedded bridge die or component 14 may be surrounded on at least four sides by encapsulant or mold compound 110.

Each of the embodiments depicted in FIGS. 2B to 2H may comprise a planarized first side or surface 64*a*, and (or) a planarized back side or surface 66*a* of the substrate core 60 to facilitate subsequent processing. While the embodiments depicted in FIGS. 2B to 2H are shown as comprising tracking identifiers 58 in substrate core 60, in further embodiments, tracking identifiers 58 may also, or instead, be disposed in dielectric layers 130, 140 as described following.

FIGS. 3A-3M illustrate various stages of forming an interconnect substrate 160.

Figure 3A:
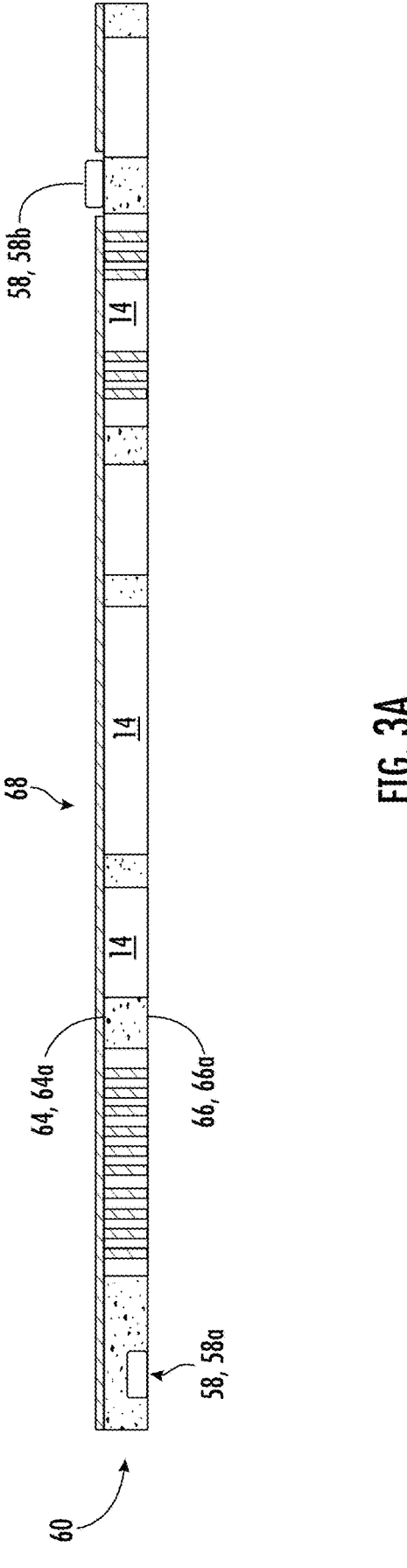
FIGS. 3A-3M illustrate various stages of forming an interconnect substrate.
Figures 3B, 3C:
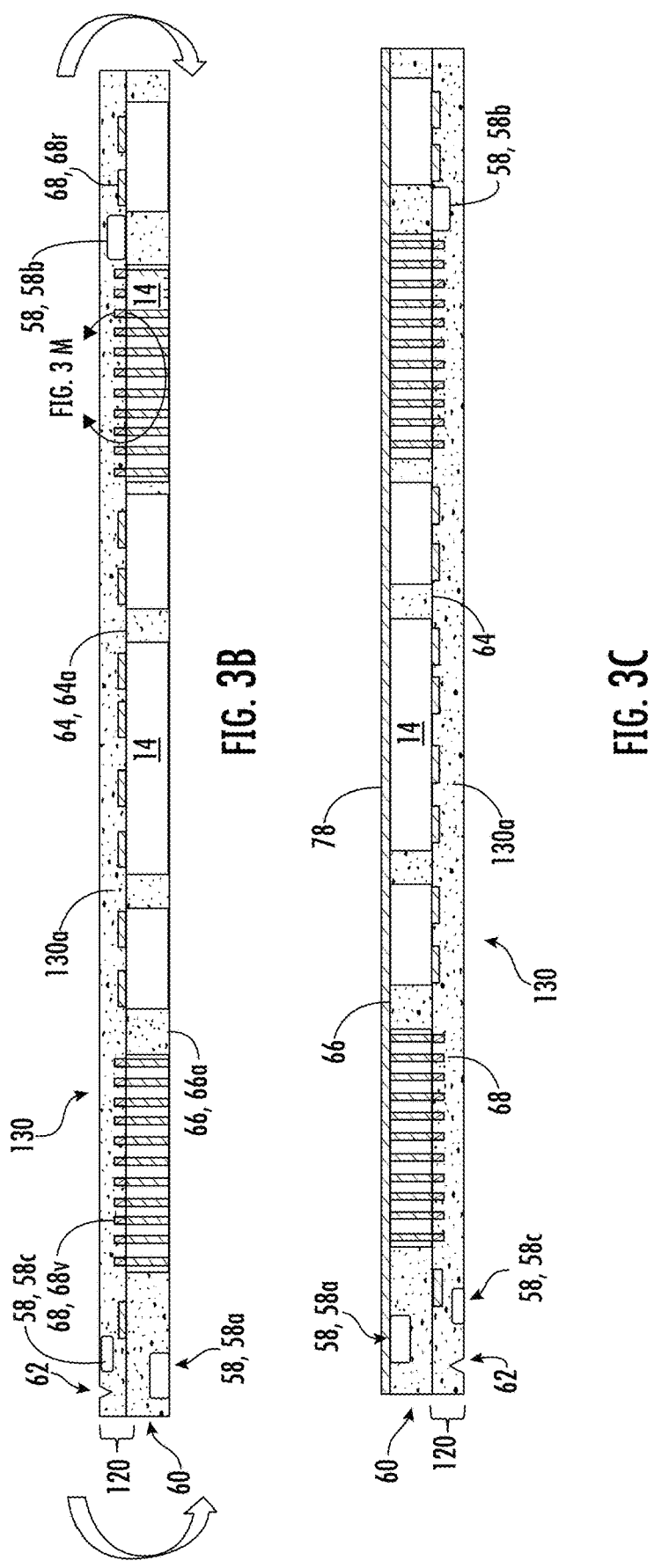
Figures 3D, 3E, 3F:
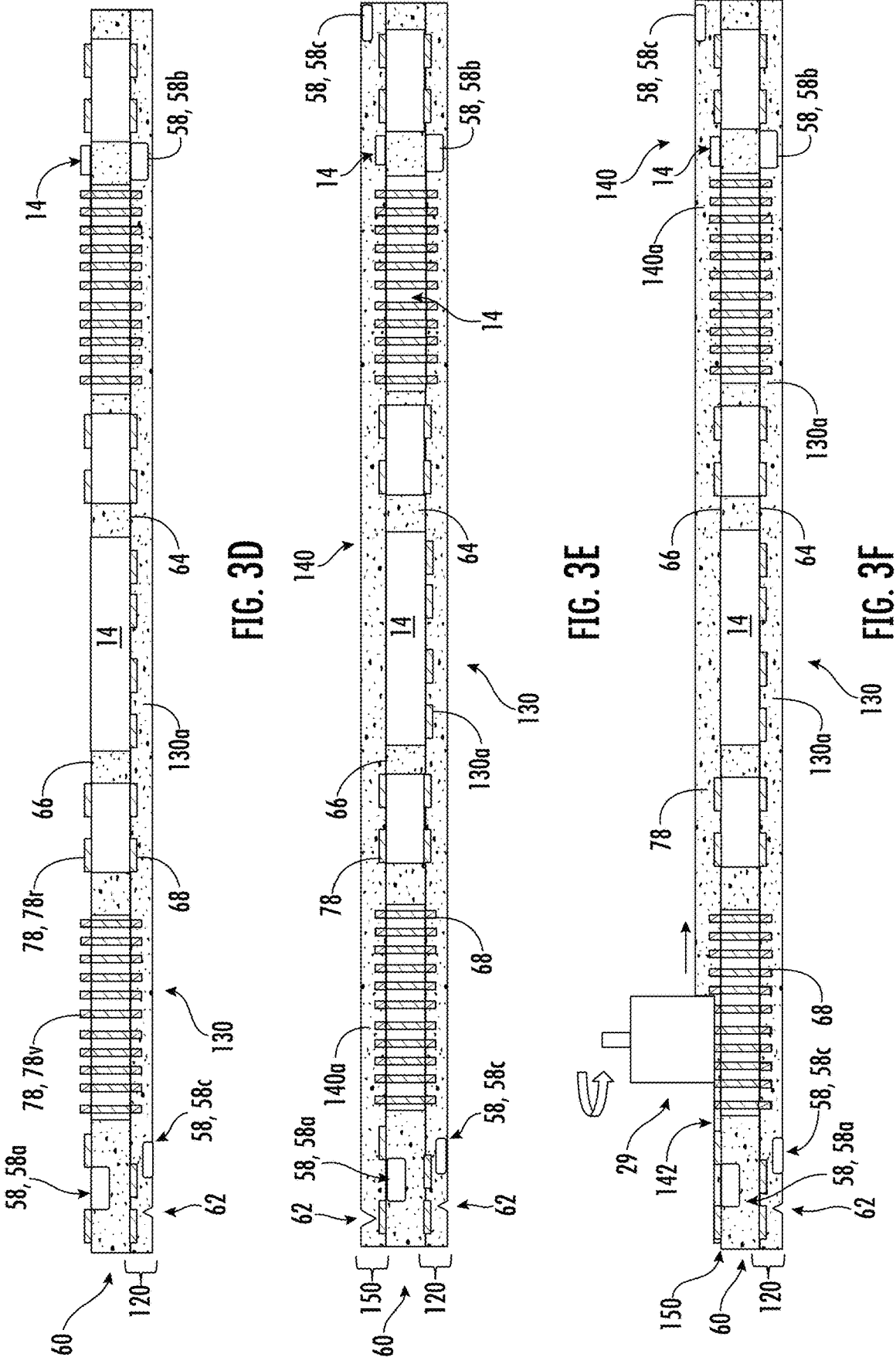

As shown in FIG. 3A, the method of making an inter-connect substrate 160 comprises forming a first frontside conductive layer 68 over a front side 64 of a substrate core 60. In some instances, forming the first frontside conductive layer 68 (as well as additional frontside conductive layers 70 and backside conductive layers 78, 80 as disclosed herein) may comprise a first conductive layer deposition process comprising forming a routing, wiring, interconnect or trace layer 68*r*, and a second conductive layer deposition process comprising forming vertical conductive contacts or inter-connects, vias, or a via layer 68*v* coupled to the routing layer 68*r*, as shown by FIGS. 3B and 3M. Formation of other conductive and dielectric routing and via layers as disclosed herein may be performed using similar, multiple deposition processes as disclosed for the detail view depicted in FIG. 3M. According to some embodiments, the substrate core 60 may comprise at least one tracking identifier 58 disposed in or directly contacting the core 60. A POSA would under-stand that any of the embodiments of substrate core 60 as shown and described for FIGS. 2B-2H could be provided as part of the method shown in FIGS. 3A-3M. A POSA would also understand that components 14 comprising conductive studs 125 disposed thereon as depicted in FIGS. 2C and 4A, may be included in the method as shown and described for FIGS. 3A-3M although not depicted.

For a subtractive process, the frontside conductive layer 68 is first added and then patterned by etching away unwanted areas through the exposed photoresist. For an additive process, the frontside conductive layer 68 is not added at the beginning, but a thin adhesion or seed layer is added by sputtering or electroless plating, then the photo-resist pattern is formed and then the frontside conductive layer 68 is plated up. After forming the first frontside conductive layer 68 over the front side 64, or planarized surface 64*a* of the substrate core 60, the method further includes patterning the first frontside conductive layer 68 to form at least one of conductive routing, wires, conductive traces, vias, lands, lines, pads, power planes, ground planes, a thermal delivery system, a power delivery system, and shielding comprising a shape including for inductors, pas-sive components, antennas, and markings for identification, 68*r*, as shown in FIG. 3B. The layers can be patterned by removal of portions of the conductive layer 68 after a blanket plating operation (subtractive process) or by an additive or other subtractive process using photolithography. The additive process involves the deposition of light sensi-tive material, e.g., photoresist, over the layer to be patterned. A pattern is transferred from a photomask to the photoresist using light or a patter is written in the photoresist using a laser beam. In one embodiment, the portion of the photo-resist pattern subjected to light is removed using a solvent (in a subtractive process), exposing portions of the under-lying layer to be patterned. In another embodiment using an additive process, the portion of the photoresist pattern is not removed using a solvent, rather, it is a base for creating a patterned trace layer in the photoresist openings and trenches. In another embodiment, the portion of the photo-resist pattern not subjected to light, the negative photoresist, is removed using a solvent, exposing portions of the under-lying layer to be patterned. The remainder of the photoresist is removed, such as by a development process to establish the pattern in the photoresist and leaving behind a patterned layer. Alternatively, some types of materials are patterned by directly depositing the material into the areas or voids formed by a previous deposition/etch process using tech-niques such as electroless and electrolytic plating.

Patterning is the basic operation by which portions of the photoresist material are partially removed, so as to provide a pattern or electroplating template for the subsequent formation of structures, such as patterning conductive traces or redistribution layers (RDLs), under bump metallization (UBM), copper posts, vertical interconnects, or other desirable structures. Photoresist is a light-sensitive material that undergoes changes in structure and properties when exposed to light. The process of changing the structure and properties of the photoresist occurs as either negative-acting photoresist or positive-acting photoresist. Second, the photoresist pattern is transferred onto the substrate surface. The transfer occurs when etching removes, or electroplating adds, the portion of the top layers of the substrate not covered by the photoresist. The chemistry of photoresists is such that the photoresist remains substantially intact and resists removal by chemical etching solutions while the portion of the top layers of the substrate core 60 not covered by the photoresist is removed by etching or a layer is added by electroplating. The process of forming, exposing, and removing the photoresist, as well as the process of removing or adding a portion of the substrate core 60 can be modified according to the particular resist used and the desired results. Negative or positive tones resist can be designed for solvent or base develop solutions.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or base developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent or a base in the development process. The basic positive photoresist polymer is the phenol-formaldehyde polymer, also called the phenol-formaldehyde novolak resin. Removing the soluble portions (i.e. the portions exposed to light) with chemical solvents or base developers leaves a hole in the resist layer that corresponds to the transparent pattern on the reticle.

The first frontside conductive layer 68 may further comprise forming vertical conductive contacts or vertical conductive interconnects, such as conductive stumps, vias and other vertically oriented connectors or structures 68v formed over and coupled to, the first frontside conductive routing layer 68r. In some instances, vertical conductive contacts 68v, 78v, as part of the conductive or redistribution layers disclosed herein, may be used to form RF structures as shown and described in FIGS. 4B-4C. The first conductive layer 68, 68r and vertical interconnects 68v may be formed using PVD, CVD, electrolytic plating, electroless plating, or other suitable metal deposition process or by a subtractive process as previously described. The first conductive layer 68 and vertical interconnects may be one or more layers of copper (Cu), aluminum (Al), tin (Sn), nickel (Ni), gold (Au), silver (Ag), titanium (Ti), Platinum (Pt), Tungsten (W) or other suitable electrically conductive material. The first conductive layer 68, 68r, 68v can be formed as one or more traces or as an RDL comprising a trace line and space of less than or equal to 2 μm for a pitch of less than or equal to 4 μm, or in other instances comprising a trace width of 1 μm and space of less than or equal to 2 μm. Thicknesses of the first conductive layer, and additional conductive layers as disclosed herein may vary between layers. In some instances, the first conductive layer 68, comprising one or more traces or as an RDL, may have a thickness of from 0.5 μm to 70 μm, or from 0.5 μm to 35 μm. Larger pitches and less dense connections are also possible. The first conductive layer 68 can also be formed as solid planes or mesh planes, including power and (or) ground planes and having increased pitch compared to the conductive layer 68 formed as traces or as an RDL. When the first conductive layer 68 is formed as solid planes or mesh planes, the first conductive layer 68 may have an increased thickness relative to conductive layers 68 comprising traces and (or) RDLs. According to some instances, the first conductive layer 68 formed as solid planes or mesh planes, may comprise a thickness of from 0.5 μm to 70 μm, or from 0.5 μm to 35 μm and in either instance a pitch of from 1 μm to 140 μm. In further instances, first conductive layer 68 can comprise combinations of trace, signal or RDL routing, and power and (or) ground planes. The disclosure relating to the first conductive layer 68, 68r and 68v also applies to all additional conductive layers as disclosed herein.

In some embodiments, the first frontside conductive layer 68 may be configured to be electrically coupled to the at least one component 14 over a front side 64, or planarized surface 64a of the substrate core 60. In optional embodiments where substrate core 60 comprises an additional dielectric or encapsulant layer on a back side of the substrate core 66, the back side of the substrate core 66 may be planarized to form planarized back side or surface of the substrate 66a using the methods as disclosed herein. The planarization process, when applied to the substrate core 60, may expose at least a portion of the one or more embedded components 14 from the core 60.

The method of making an interconnect substrate 160 as shown in FIG. 3B further comprises disposing a frontside dielectric 130 comprising a first frontside layer 130a over the front side 64 of the substrate core 60, over the at least one component 14, and over the first frontside conductive layer 68 to form first (frontside) interconnect structure or first (frontside) build-up interconnect structure 120. The frontside dielectric 130 and backside dielectric 140 (as depicted in FIG. 3E following) forming the dielectric layers as disclosed herein may comprise a mold compound, an encapsulant, a composite material, such as epoxy resin with filler, epoxy acrylate with filler, polytetrafluoroethylene, a build-up film such as for example Ajinomoto build up film (ABF), a laminate film, a polymer, polyimide, or other dielectric, including low k dielectrics, and is not a polymer material that does not perform well in a grinding or planarizing operation. In some embodiments, the frontside dielectric 130 and backside dielectric 140 may comprise a same mold compound, or different mold compounds. In further embodiments, one or more of the first interconnect structure 120 and a second interconnect structure 150 (as depicted in at least FIG. 3E) may comprise at least one dielectric layer 130, 140, respectively, comprising deposition of a polymer in a liquid state such as by a slot die coating or spin coating of the polymer, such as polyimide, formed from a slot die coating process, spin coating process or other deposition process. According to additional embodiments, the frontside dielectric 130 and backside dielectric 140, as well as additional dielectric layers as part of first interconnect structure 120 and second interconnect structure 150, may comprise additional tracking identifiers 58 disposed therein, on opposing sides of substrate core 60 such that the tracking identifiers 58 may be interrogated by the reader from either side, as earlier described. Tracking identifiers 58 may comprise tracking identifiers 58, 58*a*, 58*b*, comprising one or more of the aforementioned devices. In further embodiments, tracking identifiers 58 may comprise tracking identifiers 58, 58*c* and additional comprising various types of marks as aforementioned, applied to a surface of the dielectric for example depicted by FIG. 3B, and removed through planarization (not shown) at FIG. 3I.

In some embodiments as depicted in FIGS. 2C-2E, the substrate core 60 may be formed of dielectric 110 comprising a mold compound, an encapsulant, a composite material, such as epoxy resin with filler, epoxy acrylate with filler, polytetrafluoroethylene, a build-up film such as for example Ajinomoto build up film (ABF), a laminate film, a polymer, polyimide, or other dielectric, including low k dielectrics, and is not a polymer material that does not perform well in a grinding or planarizing operation.

In some instances, it may be desirable to deposit $SiO_2$ inorganic dielectric or other inorganic dielectric that includes silicon (such as silicon oxy-nitride, silicon nitride, or carbon doped silicon oxide) on an encapsulant, such as that within substrate core 60, frontside dielectric 130 comprising encapsulant, backside dielectric 140 comprising encapsulant, or on any other layer of encapsulant or mold compound. In doing so, the encapsulants may comprise silica filler, including 85% or more silica filler. After exposing the filler, such as by grinding to form a planar or flat surface, a majority or significant portion of the planar surface will be exposed $SiO_2$. The exposed $SiO_2$ filler can provide a good base and good adhesion for the deposition of the $SiO_2$ layer over, contacting, or on top of the exposed $SiO_2$ filler; and can also provide good overall adhesion to the encapsulant. This adhesion between the exposed $SiO_2$ filler of the encapsulants and the $SiO_2$ inorganic dielectric layer is unlike other applications where you might try to deposit the $SiO_2$ on a full plastic film (without $SiO_2$ filler) where the adhesion would not be as good.

In some embodiments, the method further comprises forming at least one alignment feature 62 in or on the encapsulant 130. After disposition of encapsulant 130, the method comprises rotating, or flipping, the substrate core 60 about a long axis of the substrate core 60 such that a back side 66 of the substrate core 60 is configured for processing, as shown in FIG. 3C.

FIG. 3C illustrates forming a first backside conductive layer 78 over the back side 66 of the substrate core 60. The first backside conductive layer 78 may further comprise forming vertical conductive contacts or interconnects, such as conductive stumps, vias and other vertically oriented connectors 78, 78*v* formed over, the first backside conductive layer 78, in a similar manner as shown and described in FIG. 3M for first frontside conductive layer 68. According to some embodiments, the first backside conductive layer 78 may be configured to be electrically coupled to the at least one component 14. As depicted by FIG. 3C, forming a conductive layer opposite a fully encapsulated layer protects the underlying conductive layers disposed within the encapsulant from damage during any processing used to form the conductive layers.

As shown in FIG. 3D and earlier described for the first frontside conductive layer 68, the method further comprises patterning the first backside conductive layer 78 to form at least one of conductive traces, vias, lands, lines and pads. In order to balance warpage and thermal performance of the substrate core 60 during subsequent use, the first frontside conductive layer 68 comprises a first area, and the first backside conductive layer 78 comprises a second area, and the first area and the second area differ in an amount less than or equal to 50%, less than or equal to 40%, less than or equal to 30%, or less than or equal to 20%. Balancing respective areas of the first frontside and first backside conductive layers allows for more effective thermal management and reduced substrate core warpage during assembly. Such balancing of the total area of frontside and backside conductive layers would similarly apply to any subsequently formed conductive layers. In addition to balancing respective areas of first frontside and first backside conductive layers 68, 78, respectively, a volume of the first frontside and first backside conductive layers 68, 78 may also be balanced for thermal management and reduced substrate core warpage during assembly such that the volume of each of the first frontside and first backside conductive layers 68, 78, is less than or equal to 40%, less than or equal to 30%, less than or equal to 20%, or less than or equal to 10%. More specifically, in some instances where the first frontside conductive layer 68 may comprise a greater thickness than first backside conductive layer 78, first backside conductive layer 78 shall comprise an area larger than that of first frontside conductive layer 68 such that a total volume of each of the first frontside conductive layer 68 and first backside conductive layer 78 are similar, or substantially similar, and within the aforementioned ranges. Similar to balancing the area, balancing the volume of the conductive layers allows for more effective thermal management and reduced substrate core warpage during assembly and similarly applies to any subsequently formed conductive layers. The total volume and formation sequence of conductive layers 68, 78 and additional layers may be customized and tailored according to the method as disclosed herein to compensate for warpage such that subsequent formation of conductive layers on an opposing side of the substrate core 60 offsets, and compensates for, warpage imparted from previous processing. As one non limiting example, first frontside conductive layer 68 may comprise signal routing having fine line and space features, such as from 1 μm to 4 μm, or about 2 μm, imparting a convex curvature to the substrate core 60. The substrate core 60 may then be flipped or rotated about a long axis and first backside conductive layer 78 may be formed opposite the first frontside conductive layer 68, reducing or eliminating the convex curvature such that subsequent processing may be performed.

According to FIG. 3E, the method comprises disposing a first backside dielectric 140, comprising a first backside layer 140*a* over the back side 66 of the substrate core 60, over the at least one component 14, and over the first backside conductive layer 78. In some embodiments, the method further comprises forming at least one alignment feature 62 and (or) at least one tracking identifier 58, in or on the dielectric 140.

As discussed for the substrate core 60 of FIG. 2B, FIG. 3F shows grinding or planarizing, using grinder 29, the first backside layer of dielectric 140*a* by grinding, chemical mechanical polishing (CMP), surface planarization, polishing, plasma etching, wet etching, or thinning by using a diamond-based cutter, to expose at least a portion of the first backside conductive layer 78 to form a first backside planar surface 142 on the first backside layer of dielectric 140*a* to create a uniformly flat, planar surface on which to form additional structures. In some embodiments, planarizing the first backside layer of dielectric 140*a* may comprise any combination of the above-referenced processes to form the first backside planar surface 142, such as for example a grinding process followed by a surface planarization process. Planarizing or grinding the encapsulant forms a planarized encapsulant surface for subsequent deposition of conductive layers forming feature sizes of small dimension, such as vias having a diameter of from 0.75 μm to about 1.5 μm, or about 1 μm, trace widths in a range of about 0.5 um to about 2 μm, or about 1 μm, and a space between traces in a range of about 1 μm to about 2 μm. The planarizing or grinding of the dielectric or encapsulant produces a flatness of within a range of about 0.5-5 micrometers and a total roughness height from peak to valley measured over a characteristic measurement distance of 1 millimeter (mm) length of between 5 and 500 nanometers (nm). While conventional encapsulant grinding might be done with less flatness, greater accuracy and precision can be obtained by using integrated sensors such as laser, acoustic, or other non-contact methods to control the grinding resulting in better flatness. According to embodiments as disclosed herein, at least one of a first frontside planar surface 132, a second frontside planar surface 134, a first backside planar surface 142 and a second backside planar surface 144 of dielectric layers 130*a*, 130*b*, 140*a*, and 140*b*, respectively, may be planarized to a surface roughness within 5 to 500 nanometers or to within 0.5-5 micrometers and a total roughness height from peak to valley measured over a characteristic measurement distance of 1 millimeter (mm) length of between 5 and 500 nanometers (nm). After the grinding or planarizing process as shown by FIG. 3F, the method as disclosed may optionally include flipping or rotating the substrate core 60, similar to as shown and described with respect to FIG. 3B, and planarizing an opposing side of the substrate core 60. In so doing, warpage of the substrate core 60 during processing may be minimized, thereby facilitating the manufacturing process. In some instances where component 14 does not comprise conductive studs or electrical interconnects 125, electrical contact to component 14 may be achieved using an additive process by adding a thin adhesion or seed layer through sputtering or electroless plating, then the photoresist pattern is formed. Alternatively, a subtractive process may be used by adding a conductive layer which is then patterned and etched away to expose areas of dielectric 140 through the photoresist. In either additive or subtractive methods, then, vias are laser drilled through dielectric 140 to expose bond pads 22, and sputtering and (or) electroplating the first or second frontside conductive layers 68, 78 respectively, as well as vias through the dielectric 140 (as depicted in FIG. 2E). In this manner, both the vias formed in the laser drilled regions of dielectric 140 contacting the component 14, and conductive trace/RDL or plane layers may be formed at a same time.

Figures 3G, 3H:
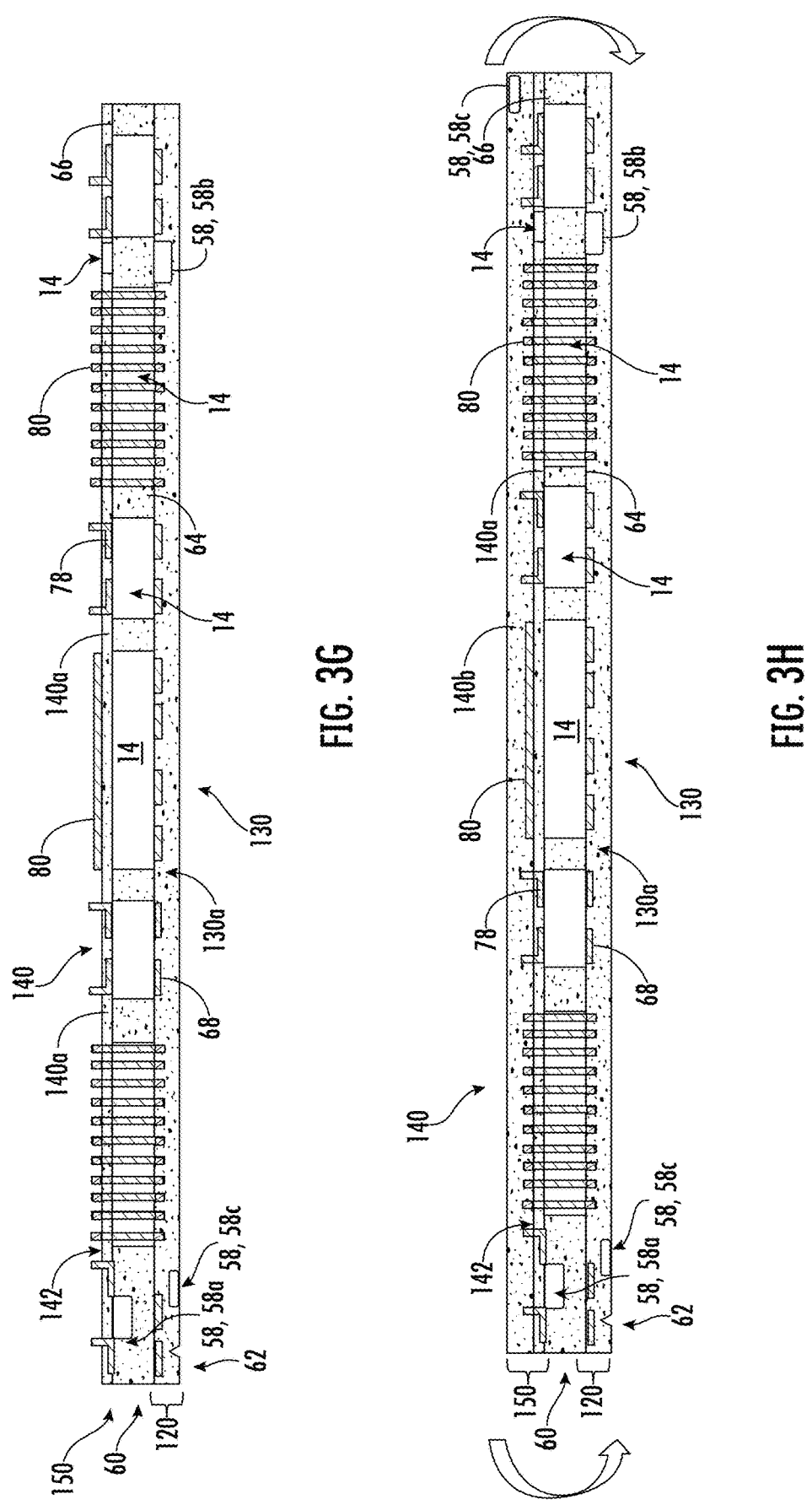
Figure 4A:
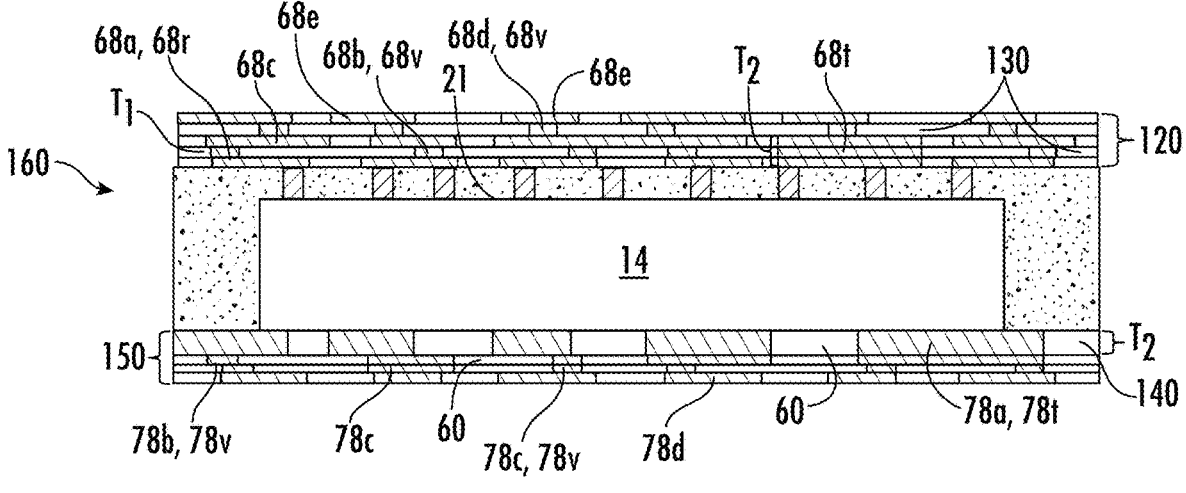
FIG. 4A depicts an interconnect substrate comprising an embedded component and interconnect structures having conductive layers of different thicknesses.

FIG. 3G illustrates forming a second backside conductive layer 80 over the first backside planar surface 142, where the second backside conductive layer 80 may be configured to be electrically coupled to one or more of the first backside conductive layer 78 and embedded component 14. The method further comprises patterning the second backside conductive layer 80 to form at least one of conductive traces, vias, lands, lines, pads, and one or more planes such as power and (or) ground planes. According to some embodiments where component 14 does not comprise conductive studs 125, the second backside conductive layer 80 may be electrically coupled to the at least one component 14 by vias which are laser drilled through dielectric 140 to contact one or more of first conductive layer 78 or bond or contact pads 22 on the component 14. In some embodiments, contact pads 22 may comprise a conductive layer having an increased thickness such that conductive material remains after laser drilling.

As shown in FIG. 3H, the method comprises disposing a second backside layer of dielectric 140*b* over the second backside conductive layer 80 and the backside planar surface 142. After disposition of the second backside layer of dielectric 140*b*, the method further includes rotating the substrate core 60 such that the first frontside layer of dielectric 130*a* is configured for processing.

Figures 3I, 3J:
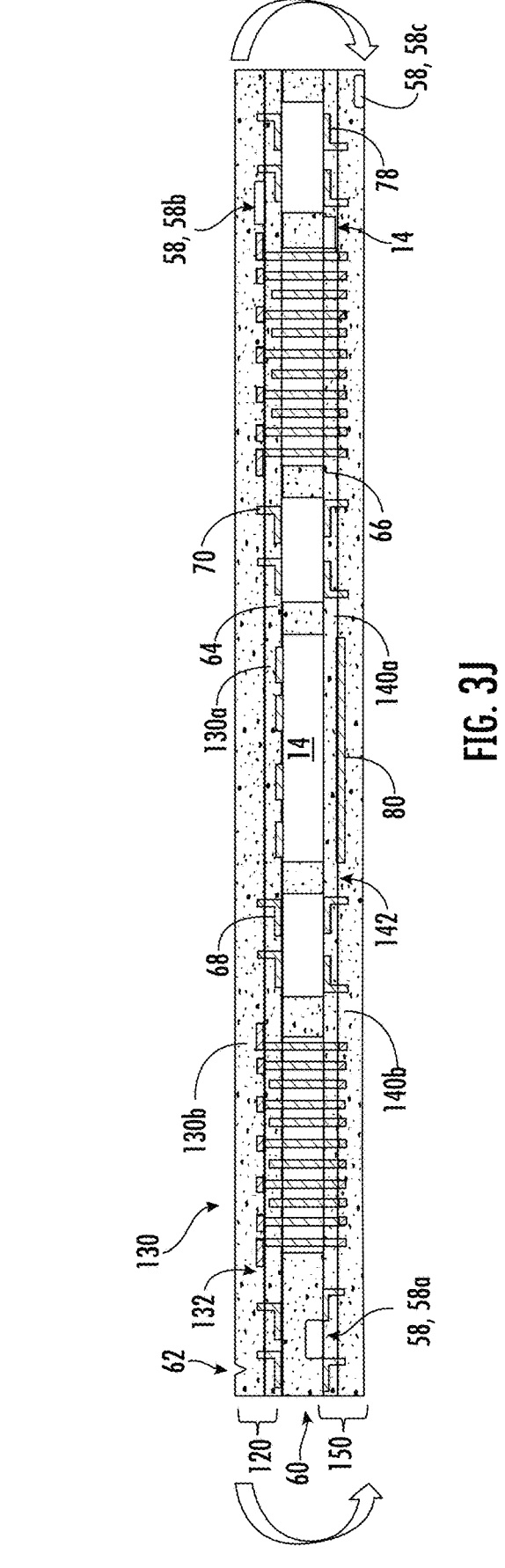

As similarly disclosed for FIG. 3F but not depicted, the first frontside layer of encapsulant 130*a* may be planarized at FIG. 3I by grinding, chemical mechanical polishing (CMP), surface planarization, polishing, plasma etching, wet etching, or thinning by using a diamond-based cutter, to expose at least a portion of the first frontside conductive layer 68 to form a first frontside planar surface 132 on the first frontside layer of encapsulant 130*a* and to remove tracking identifier 58, 58*c*. According to some embodiments, the grinding or planarizing process may remove one or more of alignment feature 62 and tracking identifier 58*c* from first frontside layer of encapsulant 130*a*, and another tracking identifier 58*c* may be reapplied to subsequent layers of frontside dielectric 130 or backside dielectric 140, or both. As further shown in FIG. 3I, a second frontside conductive layer, trace, power or ground plane 70 may be formed over the first frontside planar surface 132, the second frontside conductive layer 70 configured to be electrically coupled to one or more of the first frontside conductive layer 68 and the at least one embedded component 14. In some embodiments, the second frontside conductive layer 70 may be configured for electrical coupling to one or more of the first frontside conductive layer 68 and the at least one component 14. As disclosed for FIGS. 3A and 3B above, the method comprises patterning the second frontside conductive layer 70 to form at least one of conductive routing, wires, conductive traces, vias, lands, lines, pads, power planes, ground planes, a thermal delivery system, a power delivery system, and shielding comprising a shape including for inductors, passive components, antennas, and markings for identification.

According to FIG. 3J, the method includes disposing a second frontside layer of encapsulant 130*b* over the second frontside conductive layer 70 and the first frontside planar surface 132, and rotating the substrate core 60 such that the second backside layer of dielectric 140*b* is configured for processing. In some embodiments, second frontside layer of encapsulant 130*b* may optionally be planarized to form second frontside planar surface 134, as shown in FIG. 3K.

Figures 3K, 3L:
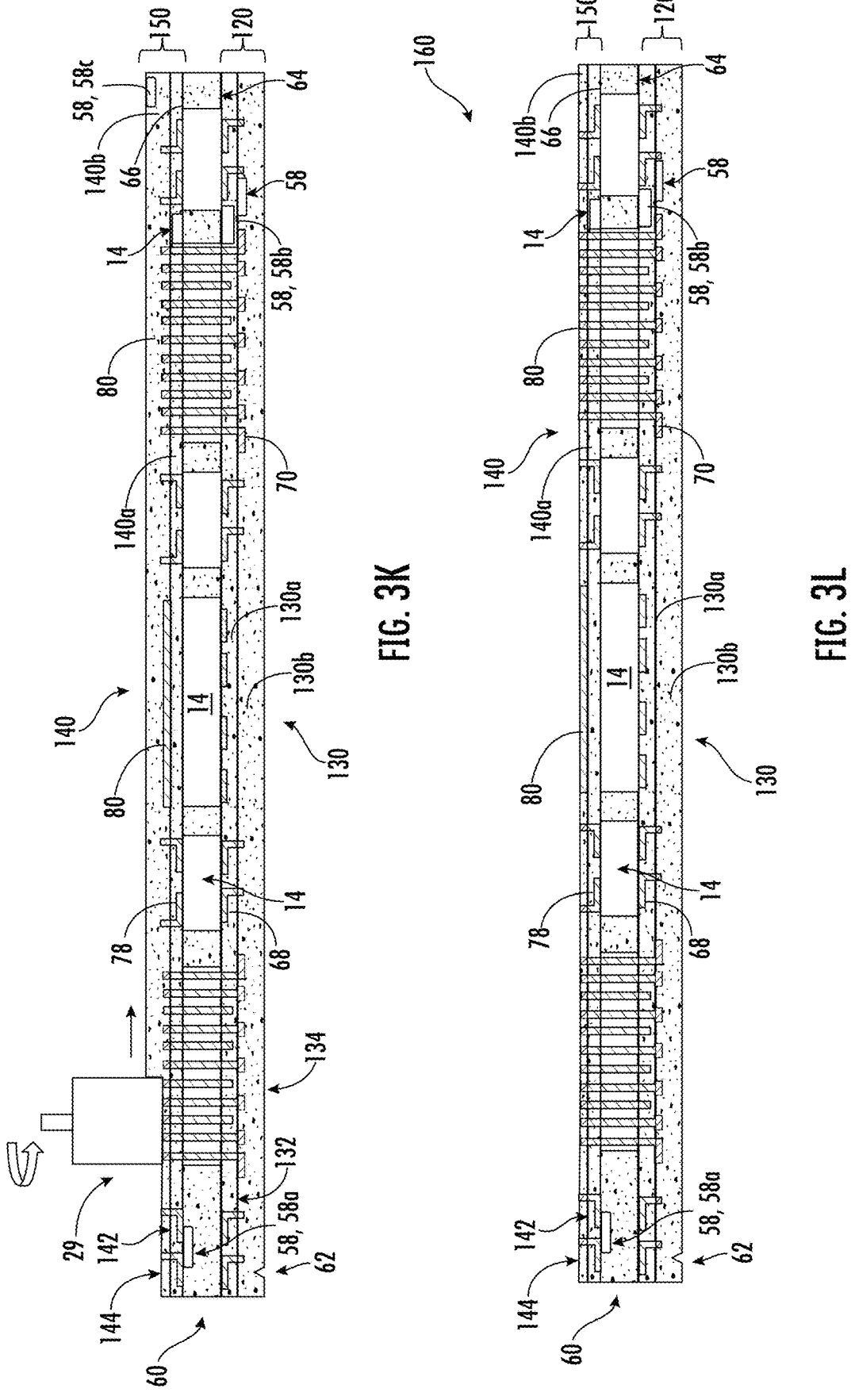
Figure 3M:
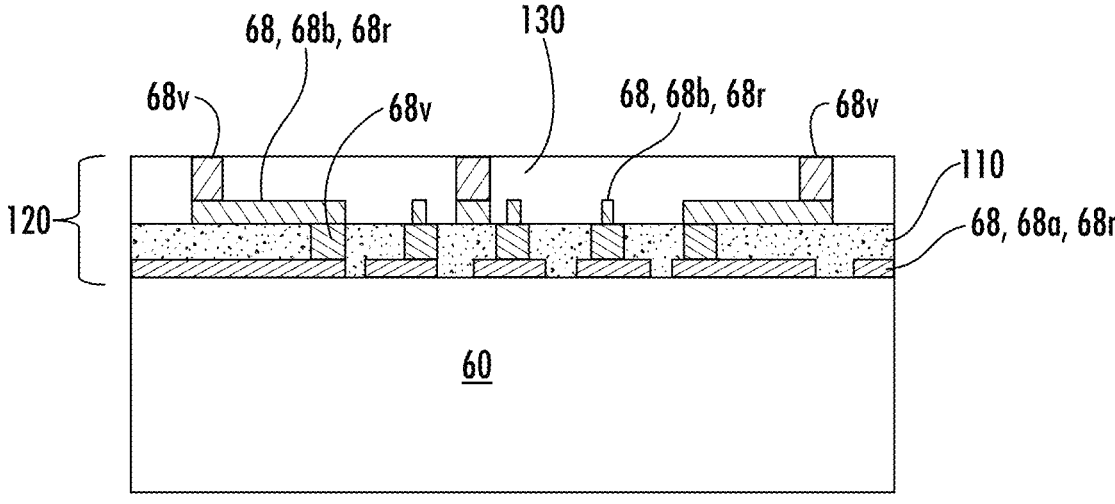

As depicted in FIG. 3K and disclosed previously in a similar configuration of FIG. 3F, the method includes planarizing the second backside layer of dielectric 140*b* by grinding, chemical mechanical polishing (CMP), surface planarization, polishing, plasma etching, wet etching, or thinning by using a diamond-based cutter, to expose at least a portion of the second backside conductive layer 80 and form a second backside planar surface 144 over the first backside planar surface 142 of the first backside layer of dielectric 140*a*. The planarization processes as disclosed herein may be performed on any of the layers of frontside dielectric 130 and backside dielectric 140, as well as additional dielectric layers shown and described for FIG. 5B. Similar to as disclosed for planarized surfaces 64*a*, 66*a* of substrate core 60, first and second frontside planar surfaces 132, 134 and first and second backside planar surfaces 142, 144 serve to reduce or eliminate any irregular topography, resulting in uniformly flat, planarized surfaces, as shown by FIG. 3K.

Figure 5A:
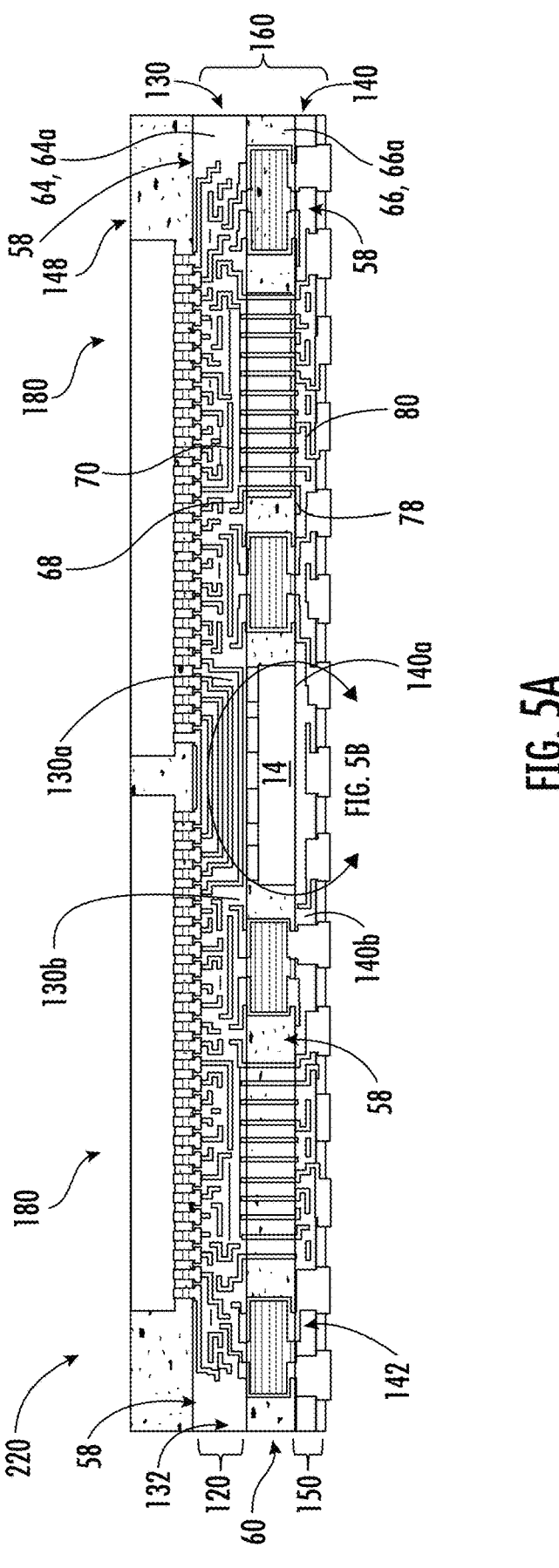
FIG. 5A shows an interconnect assembly comprising at least one peripheral device and one or more embedded components disposed in a substrate core.

FIG. 3L illustrates a nearly fully assembled interconnect substrate 160 comprising multiple, alternating layers of dielectrics 130, 140 on a frontside 64 and a backside 66 of substrate core 60, respectively, interleaved with multiple conductive layers disposed between the dielectric layers. In some embodiments, and as shown in FIG. 5A following, as taken along the detail line depicted in FIG. 2A, the method may comprise forming additional alternating layers of frontside conductive layers 68, 70 and backside conductive layers 78, 80, interleaved with alternating frontside layers of dielectric 130 and backside layers of dielectric 140, to form up to 30 layers of frontside dielectric layers 130 and up to 30 layers of backside dielectric layers 140, as shown in the detail view of FIG. 5B. Tracking identifiers 58 may be disposed in or over substrate core 60, in or over dielectric layers 130 and 140, or both.

Figure 5B:
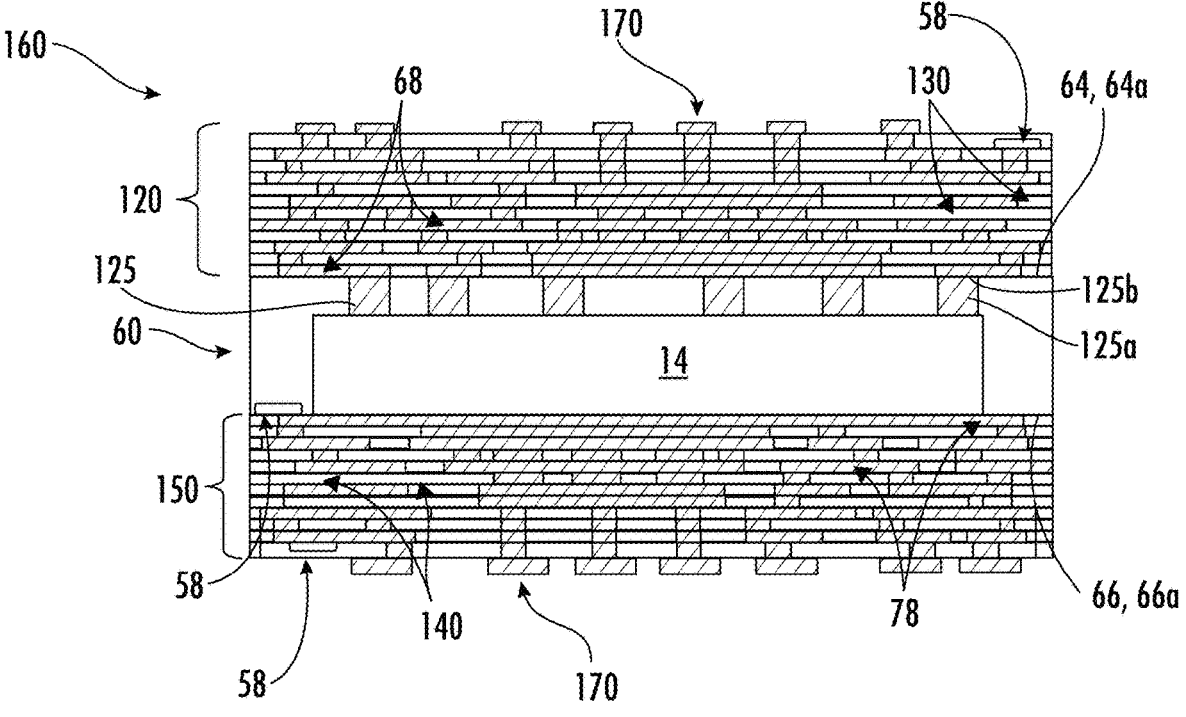
FIG. 5B illustrates a close up detail view of the interconnect assembly of FIG. 5A, showing a substrate and interconnect structures comprising multiple conductive and dielectric layers comprising tracking identifiers.

According to some embodiments, rotating or flipping the substrate core 60 about the long axis may be performed after forming more than one conductive layer, such as conductive frontside layers 68, 70 formed on the frontside 64, and (or) backside conductive layers 78, 80 formed on the backside 66 (including additional conductive layers formed on either side). For example, a first frontside conductive layer 68 and (or) second frontside conductive layer 70 (and any additional, frontside conductive layers) may comprise a thin conductive layer, having a lower or reduced thickness (when compared to other layers to be formed on an opposing side of substrate core 60) for signal routing and may comprise a thickness of from 1 μm to 4 μm, or about 2 μm and a pitch of from 1 μm to 4 μm. After forming one or more conductive layers on the frontside 64 with dielectric 130 interleaved between, and over, an outermost frontside conductive layer for protection and warpage management during processing, the substrate core 60 may be flipped or rotated, and thicker backside conductive layers, such as backside conductive layers 78, 80, and additional backside conductive layers, may be formed on the backside 66, with dielectric interleaved between, and over, an outermost frontside conductive layer for protection and warpage management during processing. It is not necessary that the frontside conductive layers and backside conductive layers be formed in a 1:1 ratio over the frontside 64 and backside 66, or to be formed in any particular order. According to some embodiments, frontside:backside conductive layers may be formed in ratios of 1:1, 2:1, 3:1, 4:1, 5:1, and even greater, as illustrated by FIGS. 4A and 5B following. As one example, two thin frontside conductive layers may be formed over the frontside 64, with encapsulant disposed therebetween and over an outermost conductive layer for protection and warpage management during processing, followed by flipping or rotating the substrate core 60, and forming a single, thick backside conductive layer over backside 66, with dielectric or encapsulant disposed over an outermost conductive layer for protection and warpage management during processing.

In some embodiments, the frontside conductive layers 68, 70 and (or) backside conductive layers 78, 80 may be formed to comprise one or more power planes of a large dimension, a power delivery system, a thermal delivery system, shielding for all or part of the substrate, a ground plane, patterned metal in any shape, including shielding comprising a shape for inductors, passive components, antennas, and markings for identification. In some instances, backside conductive layers 78, 80, and any additional, may be formed as one or more power planes and may comprise a thickness of from 9 μm to 1000 μm, from 9 μm to 500 μm, from 9 μm to 200 μm, or from 9 μm to 50 μm with spacing of about 300 μm.

FIG. 3M illustrates a detail view of FIG. 3B, showing first or frontside interconnect structure 120 comprising conductive layer 68. Conductive layer 68 may comprise vertical conductive contacts 68v, which may be formed using a same, or similar processes to that of routing layer 68, 68r, also depicted as part of conductive layer 68. A POSA would understand that the features disclosed in FIG. 3M, including vertical conductive contacts 68v, may be formed as part of one or more additional conductive layers and (or) on opposing conductive layers 78, 80 and as part of any additional conductive layers, and may be formed over and coupled to components 14 and (or) over substrate core 60. In the embodiment of FIG. 3M, an encapsulant 110 is depicted over substrate core 60, with a dielectric 130 disposed over the encapsulant. In some embodiments, dielectric 130 may comprise polyimide.

According to some instances, thicker vertical structures may be formed comprising multiple conductive layers formed atop one another, as seen in FIG. 4A. FIG. 4A illustrates an interconnect substrate 160 comprising a substrate core 60 formed from one or more of a dielectric, an encapsulant, ceramic, glass, a glass fiber woven material or core, layers of glass fiber, a glass reinforced epoxy material such as FR4, composite epoxy material (CEM), plastic, polymer, mold compound such as epoxy or a thermoset material, a printed circuit board (PCB) with or without routing, a PCB core, metal, silicon, fiberboard, layers of paper laminated with epoxy or phenolic resin, carbon fiber, and composite material such as a carbon composite, where the substrate core 60 may comprise a first (frontside) interconnect structure or first (frontside) build-up interconnect structure 120 disposed over the front side 64, 64a of substrate core 60, and the first (backside) interconnect structure or first (backside) build-up interconnect structure 150 disposed over the back side 66, 66a of the substrate core 60, where the first build-up interconnect structure 120 comprises one or more conductive layers 68, 68a-68e, and one or more insulating or dielectric layers 130. FIG. 4A also illustrates component 14 comprising conductive studs 125 disposed over front surface 21. The conductive layers 68, 68a-68e may vary in thickness from one layer to another. For example, for power applications where high current and thermal management are required and high density routing such as for signal routing is also necessary, any of conductive layers 68a-68e may comprise a thickness, T1, of from 1 μm to 4 μm, or about 2 μm for formation of thin traces having widths, or pitch, of similar dimension, where at least a portion of conductive layers 68, 68a-68e are patterned to vertically align with one another to form a stacked portion of conductive layers 68t, having a combined thickness $T_2$, comprising combined thicknesses of any or all of the conductive layers 68a-68e. In some embodiments for very high power applications, conductive layers 68, 68a-68e may be combined to form power and ground layers, planes or meshed planes where high density signal routing is not necessary and thermal dissipation is a consideration. Accordingly, in some instances the interconnect structure 120 may comprise conductive layers 68t comprising a combined thickness, $T_2$, of more than one conductive layer 68, having a thickness $T_2$ of from 9 μm to 1000 μm, from 9 μm to 500 μm, from 9 μm to 200 μm, or from 9 μm to 50 μm with spacing of about 300 μm. As shown by FIG. 4A, a trace, wiring, or routing layer may be formed from any of conductive layers 68a-68e having fine line or trace width (such as from 1 μm to 4 μm, or about 2 μm), and multiple, conductive layers combined, or "stacked" to increase thickness to form power, ground, thermal or other features as further shown and described in FIGS. 4B and 4C. Conductive layers 68t may comprise any or more than one of power distribution wires, power and (or) ground planes, power transistors in the core (with dual sided connection), and other, high current density nets or structures. In some embodiments, conductive layers 68, 68a-68e may comprise vertical interconnects or conductive stump layers 68v as shown in FIG. 4A. Backside conductive layers 78b-78j as part of interconnect structure 150 may be similarly formed as shown and described for conductive layers 68a-e, based upon requirements of the embedded component 14.

Figure 4B:
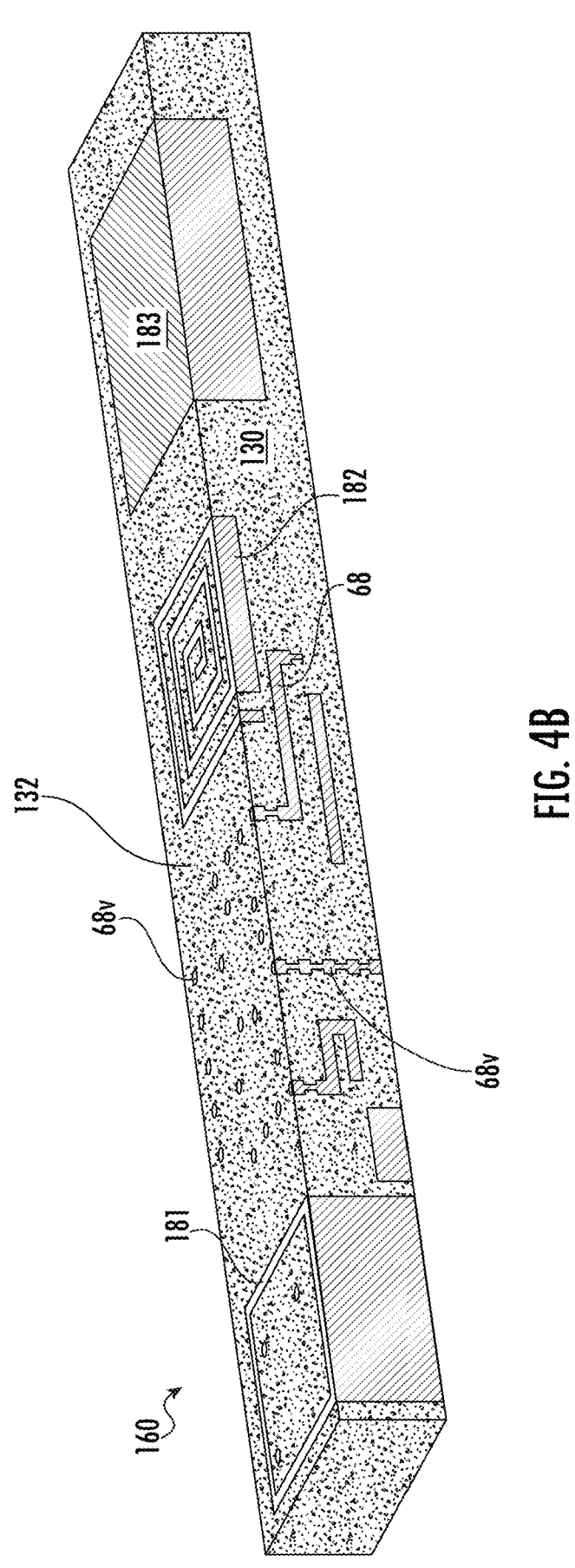
FIGS. 4B and 4C show close-up perspective views of an interconnect substrate with various shapes or features formed across multiple layers.
Figure 4C:
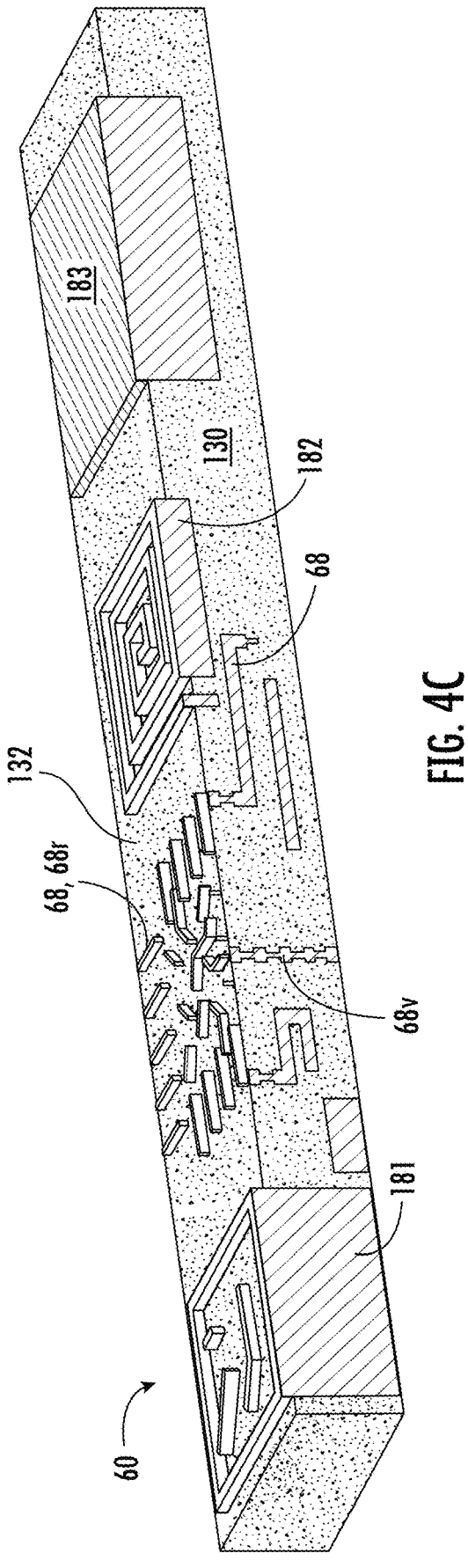

FIGS. 4B and 4C illustrate close-up perspective views of embodiments of the interconnect substrate 160, with dielectric 130 contacting, disposed around, and supporting a number of features or elements. FIGS. 4B and 4C show showing plating various shapes or features across multiple, stacked conductive layers having increased thicknesses T1, T2, and similar, as shown and described for FIG. 4A, including (moving from left to right): (i) a box shield 181 (for shielding interference and undesired RF or EM signals), as shown at the left of the figure, (ii) vertical conductive interconnects or via formation layer 68v stacked and interconnecting with or without routing or RDLs, (iii) an inductor 182, including spiral inductors, and (iv) on the right of the figure a power delivery or thermal dissipation structure 183. In further embodiments, the interconnect substrate 160 may comprise an interdigitated comb structure (not shown), or other embodiments may include capacitors with the option of a dielectric between the capacitor plates being a high dielectric constant material and thinner than the other dielectric layers (not shown). FIG. 4C, continuing from FIG. 4B, illustrates an additional conductive layer 68 being formed over the upper (planar) surface 132 of dielectric 130 and conductive material in FIG. 4B. A POSA would understand that any of the tracking identifiers 58 as shown and described herein, while not depicted, may be included in the embodiments of FIGS. 4A-4C.

While described for first frontside interconnect structure 120, the first backside interconnect structure 150 may be formed similar to, or the same as, and comprising similar elements as shown and described for first build-up interconnect structure 120. In some embodiments, first (frontside) interconnect structure 120 and first (backside) interconnect structure 150 may comprise different numbers of frontside conductive layers 68 and backside conductive layers 78, as well as different numbers of frontside dielectric layers 130 and backside dielectric layers 140 interleaved with the respective conductive layers. In some embodiments, dielectric layers 130, 140 in one or more of the first frontside interconnect structure 120 and the first backside interconnect structure 150 may comprise an outermost dielectric layer comprising polyimide disposed under at least a portion of an outermost frontside or backside conductive layer of the first frontside interconnect structure 120 and (or) the first backside interconnect structure 150, as described in greater detail in U.S. patent application Ser. No. 18/410,619 to Davis et. al., entitled "Layered Molded Direct Contact and Dielectric Structure and Method for Making the Same", filed on Jan. 11, 2024, the disclosure of which is hereby incorporated in its entirety by this reference. In some instances, one or more of outermost dielectric layers the first frontside interconnect structure 120 and the first backside interconnect structure 150 may comprise one or more tracking identifiers 58 disposed therein.

According to some embodiments, the method may comprise forming the substrate core 60 and the additional layers of frontside dielectric 130 and backside dielectric 140 from at least one mold compound using a molding process. The mold compound comprising the additional layers of frontside dielectric 130 and backside dielectric 140 may comprise at least one of a coefficient of thermal expansion (CTE) and a glass transition temperature (Tg) that are substantially the same as one another. Advantageously, selecting frontside dielectric 130 and backside dielectric 140 formed from encapsulant or mold compound having substantially the same properties of CTE and Tg may reduce warpage during the encapsulation processes of the method as disclosed. Reducing warpage during assembly may reduce overall package stress in the final interconnect assembly 220. In some instances, at least one of the frontside layer of dielectric 130 and backside layer of dielectric 140 comprises one or more outermost layers comprising polyimide (PI) disposed under, or interleaved between, at least a portion of one or more frontside or backside conductive layers. As used herein, "about" or "substantially" means a percent difference less than or equal to 40% difference, 30% difference, 20% difference, 10% difference, or 5% difference.

In a view similar to the cross-sectional view of FIG. 2B, FIG. 5A illustrates an interconnect assembly 220 comprising at least one peripheral device 180 and an interconnect substrate 160 having multiple embedded components 14 disposed in substrate core 60. Interconnect substrate 160 may comprise first (frontside) interconnect structure or first (frontside) build-up interconnect structure 120, and first (backside) interconnect structure or first (backside) build-up interconnect structure 150, disposed over substrate core 60. Substrate core 60 may comprise one or more planarized surfaces 64, 64a and 66, 66a. Interconnect structures 120 and 150 may comprise one or more layers of frontside and backside alternating conductive layers 68, 70, 78, 80 and additional conductive layers as needed, and insulating or dielectric layers 130, 140 and additional layers as needed, such as 2-12 alternating conductive or routing layers and dielectric layers, as further shown in the detail view of FIG. 5B. A person of ordinary skill in the art will appreciate that fewer layers or more layers can be used depending on the configuration and design of the embedded component 14. The first (and subsequent) dielectric layers 130, 140 can comprise one or more layers of polymer, polyimide, BCB, PBO, encapsulant, mold compound, or other material having similar insulating, dielectric and structural properties. The dielectric layers 130, 140 can be formed using printing, spin coating, slit or slot die coating, spray coating, and thermal curing. Openings can be formed through the dielectric layers 130, 140 over the conductive interconnects 125 for other desired electrical connections and conductive vias formed in the openings. In other words, conductive vias or vertical electrical interconnects (shown as 68v, 78v of FIG. 4A) may be formed as part of the interconnect structures 120 and 150 (and more specifically, e.g., the first frontside and (or) backside conductive layers 68, 78 as described herein) may form electrical interconnects through the insulating or dielectric layers 130, 140. According to some embodiments, the substrate core 60 and at least one of the first frontside layer of encapsulant 130a, the second frontside layer of encapsulant 130b, the first backside layer of dielectric 140a, the second backside layer of dielectric 140b and any additional dielectric layers, may comprise mold compounds that are formed by a molding process. The mold compounds may comprise a same mold compound having substantially the same properties of coefficients of thermal expansion (CTE) and glass transition temperatures (Tg), or the mold compounds may comprise different materials yet having substantially the same properties of coefficients of thermal expansion (CTE) and glass transition temperatures (Tg). In those instances where higher thermal conductivity is desired, component 14 may be disposed in a substrate core 60 comprising a dielectric formed of an encapsulant or mold compound comprising a particle filler of Aluminum Nitride (AlN) which has a higher thermal conductivity than that of Silicon Dioxide (SiO2) which is a typically used filler. In further instances, substrate core 60, or any of the dielectric, encapsulant, or mold compound layers disclosed herein, may comprise a low dielectric constant material, such as polyimide, polytetrafluoroethylene (PTFE), and similar.

In some embodiments, at least one of the first frontside conductive layer 68, the second frontside conductive layer 70, the first backside conductive layer 78 and the second backside conductive layer 80 are formed comprising at least one via or vertical electrical interconnect 68v, 78v. In some instances, the via may have a diameter of from 0.75 μm to 5 μm, or about 1 μm, and a trace width in a range of about 0.5 μm to about 2 μm, and a space between traces in a range of about 0.5 μm to about 2 μm. In further instances for power and (or) ground connection, larger vias may be desirable, and the first backside conductive layer 78 and the second backside conductive layer 80 (as well as any additional conductive layers) may be formed comprising at least one via or vertical electrical interconnect 68v, 78v having diameters of from about 10 μm to about 150 μm, or from about 10 μm to about 70 μm. For applications where significant thermal dissipation is required, the first backside conductive layer 78 and the second backside conductive layer 80 (as well as any additional conductive layers) may be formed comprising non-electrically connected, "dummy" thermal vias or vertical electrical interconnect 68v, 78v having a diameter the same as, or greater than that of vias formed for power and (or) ground connection. The "dummy" thermal vias may comprise diameters of from about 10 μm to about 150 μm, or from about 10 μm to about 70 μm. A POSA would understand that additional conductive layers beyond those disclosed herein may be formed, having similar via, trace or line, and space and power/ground plane features as the frontside conductive layers and backside conductive layers as shown and described. FIG. 5A further illustrates where one or more tracking identifiers 58 (location only shown for simplicity) may be disposed over or in substrate core 60, and dielectric layers 130, 140 as part of first (frontside) interconnect structure 120 and first (backside) interconnect structure 150.

As shown by the detail view of FIG. 5B continuing from FIG. 5A, embedded components 14 may comprise conductive studs or conductive interconnects 125 disposed over a surface of the components. The conductive layers 68, 78, and any additional conductive layers can be formed using unit-specific patterning to align the conductive layers with a true position of a plurality of semiconductor die or components 14, or the true position of other features, such as conductive studs 125 (where components 14 comprise such), another design feature, or an edge of the substrate core 60. When positions of semiconductor die or components 14 and conductive studs 125 (or other, selected features) shift from nominal positions such as during placement and encapsulation of the components 14 for formation of the substrate core 60 and (or) additional dielectric layers 130, 140, the true or actual positions of the semiconductor die or component 14 may not sufficiently align with the nominal design of the conductive layers, including RDL and trace positions, for the structure to provide desired reliability for package interconnections given desired routing densities and pitch tolerances. When shifts in the positions of semiconductor die or component 14 are small, no adjustments to the positions of the conductive layers may be required to properly align the openings with the conductive studs 125, or other selected features. However, when changes in the positions of semiconductor die or components 14 are such that the nominal position does not provide adequate alignment with, and exposure to, the conductive studs 125 (or other selected features), then adjustments to the position of the conductive layers can be made by unit-specific patterning (or "Adaptive Patterning™") as described in greater detail in U.S. patent application Ser. No. 13/891,006, issued as U.S. Pat. No. 9,196,509, titled "Adaptive Patterning for Panelized Packaging" filed May 9, 2013, the disclosure of which is hereby incorporated herein by reference. Unit-specific patterning can optionally adjust the position of features of the conductive layers (including traces, bussing lines, mesh, thermal, power and (or) ground planes, and tie bars) for each component 14 individually, or can adjust positions for a number of components 14 simultaneously. The position, alignment, or position and alignment of features of components 14 can be adjusted by an x-y translation or by rotation of an angle θ with respect to their nominal positions or with respect to a point of reference or fiducial on the substrate core 60. Use of unit specific patterning to adjust the alignment (and reduce misalignment) of selected features, such as the conductive layers, vias and other features depicted in FIG. 5B, enables the formation of traces, vias, and other design features at micron scale dimensions, thereby increasing overall package density.

In some embodiments, at least one of the frontside conductive layers and the backside conductive layers comprises an outermost layer comprising pads, lands, or land grid array (LGA) interconnects 170 for coupling to at least one peripheral device 180, package on package (POP) stacking, connection to a printed circuit board or other external device or substrate. The peripheral devices 180 may be disposed on one or both sides of the interconnect substrate 160 and surrounded on at least four sides by peripheral encapsulant 148. Peripheral encapsulant 148 may have the same properties as dielectric layers 130, 140 as disclosed herein, and formed by similar methods.

Figure 6:
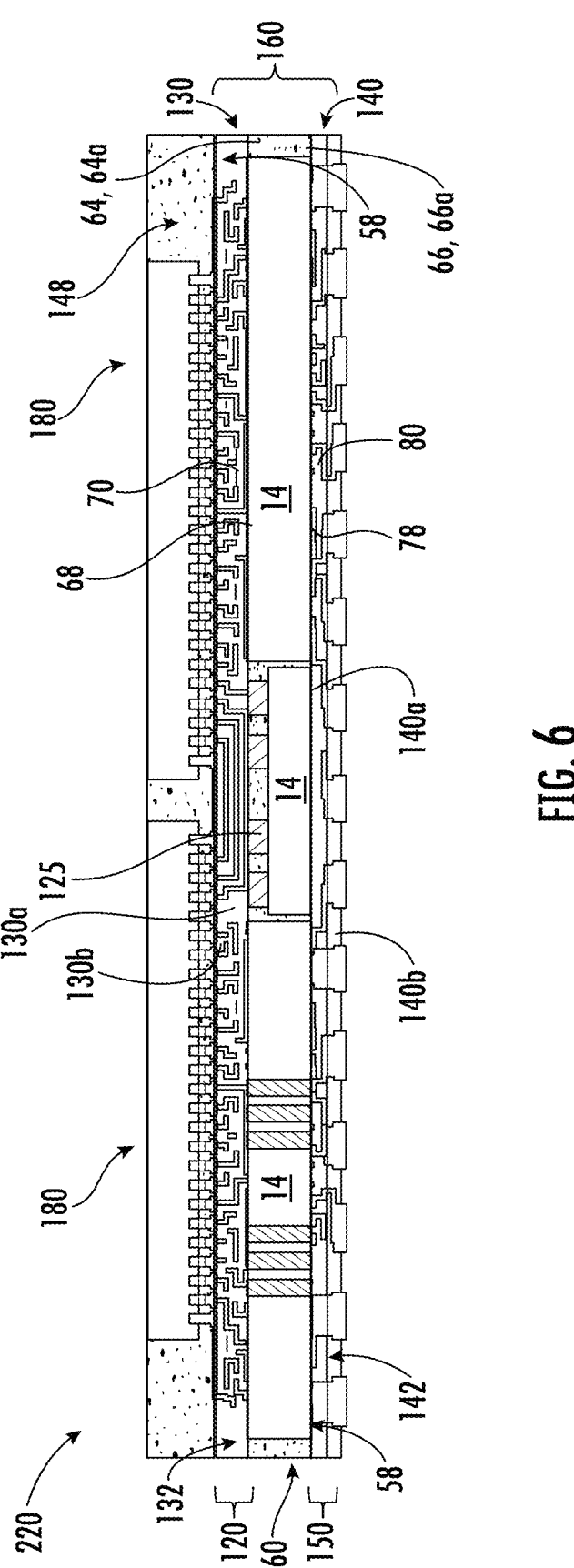
FIG. 6 depicts an interconnect assembly comprising tracking identifiers and at least one peripheral device and an embedded component comprising through silicon vias (TSVs) disposed in a substrate core.

Depicted in FIG. 6 is an embodiment of an interconnect assembly 220 where the substrate core 60 comprises at least one embedded component 14 comprising at least one vertical interconnect block or at least one double sided bridge die as component 14 comprising through silicon vias (TSVs) 27 extending through a thickness of the component. In some embodiments, the embedded component or double-sided bridge die 14 may be planarized by grinding, chemical mechanical polishing (CMP), surface planarization, polishing, plasma etching, wet etching, or thinning by using a diamond-based cutter to expose opposing ends of the TSVs 27 and form opposing, planarized ends 27a (as shown in FIG. 2H). As further shown by FIG. 6, embedded components 14 may comprise conductive studs or conductive interconnects 125 disposed over a surface of the components 14. As also shown for FIGS. 5A and 5B, tracking identifiers 58 may be disposed in or over substrate core 60, in or over dielectric layers 130 and 140, or both.

Many additional implementations are possible. Further implementations are within the CLAIMS. It will be understood that implementations of the disclosure include but are not limited to the specific components disclosed herein, as virtually any components consistent with the intended operation of the disclosure may be utilized. Accordingly, for example, it should be understood that, while the drawings and accompanying text show and describe particular implementations, any such implementation may comprise any one or more of shape, size, style, type, model, version, class, grade, measurement, concentration, material, weight, quantity, and the like consistent with the intended operation of the disclosure.

The concepts disclosed herein are not limited to the specifics shown or discussed herein. For example, it is specifically contemplated that the components included in particular embodiments may be formed of any of many different types of materials or combinations that can readily be formed into shaped objects and that are consistent with the intended operation of the disclosure. Furthermore, elements or features may be manufactured separately and then assembled together, or any or all of the components may be manufactured simultaneously and integrally joined with one another.

In places where the description above refers to particular implementations, it should be readily apparent that a number of modifications may be made without departing from the spirit thereof and that these implementations may be applied to other implementations disclosed or undisclosed. The presently disclosed features, aspects, elements, and embodiments are, therefore, to be considered in all respects as illustrative and not restrictive.

What is claimed is:

1. A method of making an interconnect substrate, comprising:

disposing at least one embedded component in a substrate core, wherein:

the substrate core comprises one or more of: a dielectric, encapsulant, ceramic, glass, polymer, mold compound such as epoxy or a thermoset material, at least one tracking identifier, a printed circuit board (PCB) with or without routing, a PCB core, and silicon, and combinations thereof, and the at least one embedded component comprising one or more of: a semiconductor chip or semiconductor device, a chiplet, an active device or active component, an integrated circuit (IC), a passive device, an integrated passive device (IPD), a deep trench capacitor (DTC), a transformer, a voltage regulator, power management IC (PMIC), a filter, a switch, an amplifier, an interface, a repeater or retimer, a clock, a processor, a controller, an accelerator, a memory, a non-volatile memory (NVM), a cache, a bridge die, and a buffer;

planarizing a front surface of the substrate core to form a base frontside planar surface and expose at least a portion of the at least one embedded component;

forming a first frontside conductive layer over the base frontside planar surface, the first frontside conductive layer comprising one or more of traces, vias, lands, lines, pads, and planes configured for coupling to the at least one embedded component;

disposing a first frontside layer of dielectric over the frontside planar surface, the at least one embedded component, and the first frontside conductive layer;

rotating the substrate core with the first frontside layer of dielectric unplanarized such that a back surface of the substrate core is configured for processing;

forming a first backside conductive layer comprising one or more of traces, vias, lands, lines, pads, and planes over the back surface of the substrate core;

disposing a first backside layer of dielectric over the back surface of the substrate core and over the first backside conductive layer;

rotating the substrate core with the first backside layer of dielectric unplanarized such that the first frontside layer of dielectric is configured for processing; and planarizing the first frontside layer of dielectric to expose at least a portion of the first frontside conductive layer to form a first frontside planar surface on the first frontside layer of dielectric.

2. The method of claim 1, further comprising:

planarizing the back surface of the substrate core opposite the front surface to form a backside planar surface and expose at least a portion of the at least one embedded component.

3. The method of claim 1, further comprising:

wherein disposing the first backside layer of dielectric over the back surface of the substrate core and over the first backside conductive layer further comprises disposing the first backside layer of dielectric over the at least one embedded component;

forming a second frontside conductive layer over the first frontside planar surface, the second frontside conductive layer comprising one or more of traces, vias, lands, lines, pads, and planes configured for coupling to the first frontside conductive layer;

disposing a second frontside layer of dielectric over the first frontside planar surface and the second frontside conductive layer;

rotating the substrate core with the second frontside layer of dielectric unplanarized such that the first backside layer of dielectric is configured for processing;

planarizing the first backside layer of dielectric by grinding, chemical mechanical polishing (CMP), surface planarization, polishing, plasma etching, wet etching, or thinning by using a diamond-based cutter, to expose at least a portion of the first backside conductive layer to form a first backside planar surface on the first backside layer of dielectric;

forming a second backside conductive layer comprising one or more of traces, vias, lands, lines, pads, and planes over the first backside planar surface, the second backside conductive layer configured to be electrically coupled to the first backside conductive layer;

disposing a second backside layer of dielectric over the second backside conductive layer and the first backside planar surface;

rotating the substrate core with the second backside layer of dielectric unplanarized such that the second frontside layer of dielectric is configured for processing;

forming a second frontside conductive layer comprising one or more of traces, vias, lands, lines, pads, and planes over the first frontside planar surface, the second frontside conductive layer configured to be electrically coupled to the first frontside conductive layer;

disposing a second frontside layer of dielectric over the second frontside conductive layer and the first frontside planar surface;

rotating the substrate core such that the second backside layer of dielectric is configured for processing, and planarizing the second backside layer of dielectric to expose at least a portion of the second backside conductive layer to form a second backside planar surface on the second backside layer of dielectric.

4. The method of claim 3, wherein at least one of the first frontside layer and the second frontside layer of dielectric and the first backside layer and the second backside layer of dielectric comprise mold compounds that are formed by a molding process.

5. The method of claim 4, wherein the mold compounds comprise at least one of a coefficient of thermal expansion (CTE) and a glass transition temperature (Tg) that are substantially the same as one another.

6. The method of claim 3, further comprising at least one tracking identifier comprising a 2-dimensional (2D) code, a laser mark, an ink mark, a data matrix code, an ecc200 code or a QR code, an antenna, an RFID component, or a directional component in or on at least one of the first frontside layer, the second frontside layer, the first backside layer and the second backside layer of dielectric.

7. The method of claim 6, further comprising reading the at least one tracking identifier, removing the at least one tracking identifier by planarizing, and reapplying the at least one tracking identifier.

8. The method of claim 6, wherein the method further comprises reading the at least one tracking identifier.

9. The method of claim 3, further comprising forming additional alternating layers of frontside conductive layers and backside conductive layers, interleaved with alternating frontside and backside layers of dielectric, to form up to 30 layers of frontside conductive layers and backside conductive layers, and up to 30 layers of frontside and backside dielectric layers.

10. The method of claim 9, further comprising one or more tracking identifiers comprising a 2-dimensional (2D) code, a laser mark, an ink mark, a data matrix code, an ecc200 code or a QR code, an inductor, an antenna, an RFID component, or a directional component disposed in or on the alternating frontside and backside layers of dielectric.

11. The method of claim 10, wherein the method further comprises:

reading the at least one tracking identifier, removing the at least one tracking identifier by planarizing, and reapplying the at least one tracking identifier in or on the alternating frontside and backside layers of dielectric.

12. The method of claim 9, wherein at least one of the frontside conductive layers and the backside conductive layers are formed comprising a trace width in a range of about 0.5 um to about 2 μm and a space between traces in a range of about 1 μm to about 2 μm.

13. The method of claim 9, wherein at least one of the frontside conductive layers and the backside conductive layers are formed with vias having a diameter of about 0.75 μm to about 1.5 μm.

14. The method of claim 9, wherein one or more of the first frontside layer, the second frontside layer, the first backside layer and the second backside layer of dielectric comprises a mold compound, a composite material, such as epoxy resin with filler, epoxy acrylate with filler, polytetrafluoroethylene, a build-up film, a low k dielectric, a polyimide, and a polymer.

15. The method of claim 9, wherein one or more of the alternating frontside and backside layers of dielectric comprises an outermost layer, wherein the outermost layer comprises polyimide (PI) disposed under at least a portion of an outermost frontside conductive layer or a backside conductive layer.

16. The method of claim 15, wherein at least one of the outermost frontside conductive layer or the backside conductive layer comprises pads for coupling to conductive interconnects of at least one peripheral device.

17. The method of claim 3, wherein one or more of the first frontside planar surface and the first backside planar surface are planarized to a surface roughness within 5 to 500 nanometers.

18. The method of claim 3, further comprising forming one or more of the first frontside conductive layer, the second frontside conductive layer, the first backside conductive layer, and the second backside conductive layer comprising one or more of power planes, a thermal delivery system, a power delivery system, a ground plane, and a shielding, comprising a shape including for inductors, passive components, antennas, and markings for identification.

19. The method of claim 3, further comprising forming one or more of the first frontside conductive layer, the second frontside conductive layer, the first backside conductive layer and the second backside conductive layer as a portion of an interconnect structure comprising unit specific patterning.

20. The method of claim 1, wherein the at least one tracking identifier comprises a 2-dimensional (2D) code, a laser mark, an ink mark, a data matrix code, an ecc200 code or a QR code, an inductor, an antenna, an RFID component, or a directional component.

21. The method of claim 1, wherein the substrate core comprises a thickness in a range of 0.04 mm to 1 cm.

22. The method of claim 1, further comprising forming one or more of the first frontside conductive layer and the first backside conductive layer with unit specific patterning.

23. The method of claim 1, wherein the first frontside conductive layer or second frontside conductive layer comprises a first area, and the first backside conductive layer or second backside conductive layer comprises a second area, and the first area and the second area differ in an amount by area of less than or equal to 30%.

24. The method of claim 1, further comprising disposing a first tracking identifier on or in a front side of the substrate core, and disposing a second tracking identifier on a back side of the substrate core.

25. A method of making an interconnect substrate, comprising:

forming a first frontside conductive layer over a front side of a substrate core, wherein the front side is planarized by grinding, chemical mechanical polishing (CMP), surface planarization, polishing, plasma etching, wet etching, or thinning by using a diamond-based cutter, and the substrate core comprises one or more of a dielectric, encapsulant, a resin, polymer, a printed circuit board (PCB), a PCB core, mold compound such as epoxy or a thermoset material;

disposing a first frontside layer of dielectric over the front side of the substrate core and over the first frontside conductive layer;

marking a surface of the first frontside layer of dielectric with at least one tracking identifier comprising one or more of a laser mark, an ink mark, a 2D code, a data matrix code, an ecc200 code or a QR code;

rotating the substrate core such that a back side of the substrate core is configured for processing; and forming a first backside conductive layer over the back side of the substrate core.

26. The method of claim 25, further comprising:

disposing a first backside layer of dielectric over the back side of the substrate core and over the first backside conductive layer;

planarizing the first backside layer of dielectric to expose at least a portion of the first backside conductive layer to form a first backside planar surface on the first backside layer of dielectric;

forming a second backside conductive layer over the first backside planar surface;

disposing a second backside layer of dielectric over the second backside conductive layer and the first backside planar surface;

rotating the substrate core such that the first frontside layer of dielectric is configured for processing; and planarizing the first frontside layer of dielectric to expose at least a portion of the first frontside conductive layer to form a first frontside planar surface on the first frontside layer of dielectric.

27. The method of claim 25, further comprising forming additional alternating frontside and backside conductive layers with additional frontside and backside layers of dielectric up to 30 layers of frontside and backside dielectric layers.

28. The method of claim 27, further comprising forming one or more tracking identifiers comprising a 2-dimensional (2D) code, a laser mark, an ink mark, a data matrix code, an ecc200 code or a QR code, an inductor, an antenna, an RFID component, or a directional component in or on one or more of the additional alternating frontside and backside conductive layers of dielectric.

29. The method of claim 28, further comprising:

marking the additional frontside and backside layers of dielectric with the at least one tracking identifier;

reading the at least one tracking identifier;

removing the at least one tracking identifier by planarizing, and reapplying the at least one tracking identifier.

30. The method of claim 29, further comprising planarizing the additional frontside and backside layers of dielectric to a surface roughness within 5 to 500 nanometers.

\* \* \* \* \*